US011592496B2

(12) United States Patent
Viswasam et al.

(10) Patent No.: US 11,592,496 B2
(45) Date of Patent: Feb. 28, 2023

(54) OPTICAL SENSING METHODS AND SYSTEMS FOR TRANSFORMERS, AND THE CONSTRUCTION THEREOF

(71) Applicant: Hyperion Sensors Inc., Markham (CA)

(72) Inventors: Anselm Viswasam, Markham (CA); Gerald Manuelpillai, Ajax (CA); Guang Zeng, Mississauga (CA); Ilya Tchaplia, Thornhill (CA); Nick DiPardo, Guelph (CA)

(73) Assignee: Hyperion Sensors Inc., Markham (CA)

( * ) Notice: Subject to any disclaimer, the term of this patent is extended or adjusted under 35 U.S.C. 154(b) by 1224 days.

(21) Appl. No.: 16/050,235

(22) Filed: Jul. 31, 2018

(65) Prior Publication Data

US 2019/0041446 A1    Feb. 7, 2019

Related U.S. Application Data

(60) Provisional application No. 62/539,766, filed on Aug. 1, 2017.

(51) Int. Cl.
*G01R 31/62* (2020.01)
*G01K 1/14* (2021.01)
(Continued)

(52) U.S. Cl.
CPC ............ *G01R 31/62* (2020.01); *G01K 1/14* (2013.01); *G01K 11/32* (2013.01); *G01K 13/00* (2013.01);
(Continued)

(58) Field of Classification Search
CPC .......... G01R 15/18–188; G01R 31/50; G01R 31/56; G01R 31/62; G01R 31/72
See application file for complete search history.

(56) References Cited

U.S. PATENT DOCUMENTS 466,496 A    1/1892  Isaac
3,576,991 A * 5/1971  Wilson .................... B61L 1/187
                                                       246/40
(Continued)

FOREIGN PATENT DOCUMENTS

CA           2903912 A1    9/2014
CN         201584221 U     9/2010
(Continued)

OTHER PUBLICATIONS

Xiaoyi Bao and Liang Chen, "Recent Progress in Distributed Fiber Optic Sensors." Sensors, Dec. 2012, 8601-8639; doi:10.3390/s120708601. ISSN 1424-8220. MDPI, Basel, Switzerland. Available Online: http://www.mdpi.com/1424-8220/12/7/8601/htm.
(Continued)

*Primary Examiner* — Huy Q Phan
*Assistant Examiner* — David B Frederiksen
(74) *Attorney, Agent, or Firm* — Bereskin & Parr LLP/S.E.N.C.R.L., s.r.l.

(57) ABSTRACT

Sensing methods and systems for transformers, and the construction thereof, are described herein. Example transformer systems and example methods for constructing a core for the system are disclosed. The example system includes a core with a bottom plate, two or more limbs mounted to the bottom plate and a top plate enclosing the core. At least one of the bottom plate, the limbs and the top plate is formed with a sensing component therein. The sensing component can be mounted to a spacer layer assembled within a stack of laminated layers. The sensing component can be mounted within a path defined within the spacer layer, for example. Methods for detecting operating conditions within the transformer are also disclosed.

8 Claims, 19 Drawing Sheets

(51) Int. Cl.
*G01K 11/32* (2021.01)
*H01F 27/28* (2006.01)
*H01F 27/32* (2006.01)
*H01F 27/40* (2006.01)
*H01F 41/12* (2006.01)
*H01F 41/04* (2006.01)
*G01K 13/00* (2021.01)

(52) U.S. Cl.
CPC ....... *H01F 27/2871* (2013.01); *H01F 27/402* (2013.01); *H01F 41/04* (2013.01); *H01F 41/12* (2013.01); *H01F 27/323* (2013.01); *H01F 2027/404* (2013.01); *H01F 2027/406* (2013.01)

(56) References Cited

U.S. PATENT DOCUMENTS

| | | | |
|---|---|---|---|
| 4,999,743 | A | 3/1991 | Fontana et al. |
| 5,651,175 | A | 7/1997 | Grimes et al. |
| 5,657,307 | A | 8/1997 | Taneya et al. |
| 5,751,413 | A | 5/1998 | Chung et al. |
| 6,060,978 | A * | 5/2000 | Marquardt ............ H01F 27/245 336/212 |
| 6,127,760 | A | 10/2000 | Nagasaki et al. |
| 7,190,868 | B2 | 3/2007 | Yamamoto et al. |
| 7,432,699 | B2 * | 10/2008 | AF Klercker Alakula ................ H01F 27/38 324/117 R |
| 7,499,151 | B2 | 3/2009 | Bao et al. |
| 9,484,146 | B2 | 11/2016 | Hinz et al. |
| 10,473,706 | B2 | 11/2019 | Manuelpillai et al. |
| 11,175,351 | B2 | 11/2021 | Manuelpillai et al. |
| 2004/0258373 | A1 | 2/2004 | Andreassen |
| 2006/0130571 | A1 | 6/2006 | Thrush et al. |
| 2010/0064788 | A1 | 3/2010 | Hofler et al. |
| 2012/0206162 | A1 * | 8/2012 | Leonov ................ G01N 27/90 324/765.01 |
| 2012/0267962 | A1 | 10/2012 | Hanchett, Jr. |
| 2013/0149565 | A1 * | 6/2013 | Conell .................... B60L 58/12 429/10 |
| 2014/0232383 | A1 * | 8/2014 | Peck, Jr. ................ G01R 33/04 324/244 |
| 2015/0084442 | A1 | 3/2015 | Tang et al. |
| 2015/0147912 | A1 | 5/2015 | Lutz et al. |
| 2015/0226679 | A1 | 8/2015 | Uno et al. |
| 2015/0235759 | A1 | 8/2015 | Hinz et al. |
| 2015/0293243 | A1 | 10/2015 | Avenson et al. |
| 2016/0003378 | A1 | 1/2016 | Von Herzen et al. |
| 2016/0003782 | A1 | 1/2016 | Von Herzen et al. |
| 2016/0322149 | A1 * | 11/2016 | Zhang .................... H01F 27/28 |
| 2017/0171662 | A1 | 6/2017 | Russell |
| 2018/0033545 | A1 * | 2/2018 | Schrammel ............ H01F 27/10 |

FOREIGN PATENT DOCUMENTS

| | | |
|---|---|---|
| CN | 102280191 A | 12/2011 |
| CN | 202178092 U | 3/2012 |
| CN | 103487164 A | 1/2014 |
| CN | 104296859 A | 1/2015 |
| CN | 204117816 U | 1/2015 |
| WO | 2011011969 A1 | 2/2011 |
| WO | 2012031447 A1 | 3/2012 |

OTHER PUBLICATIONS

Dexter Johnson, "Simulation Enables the Next Generation of Power Transformers and Shunt Reactors." Comsol Multiphysics, May 2014, pp. 6-9. Available Online: https://www.comsol.com/story/download/191989/Siemens_MS2014.pdf.

Alejandro Roberto Tello Campos et al. "Simulation of a distribution transformer." WSEAS Transactions on Fluid Mechanics, Issue 3, vol. 7, Jul. 2012. pp. 106-115. E-ISSN: 2224-347X. Available Online: www.wseas.org/multimedia/journals/fluid/2012/55-218.pdf.

Anthony Wayne Brown, "Development of a Brillouin Scattering Based Distributed Fibre Optic Strain Sensor." PhD thesis, The University of New Brunswick, Oct. 2000, pp. 31-42 ("2.5 Principles of Brillouin scattering based distributed sensing"). / Publication: ProQuest Dissertations and Theses; Thesis (Ph.D.)—University of New Brunswick (Canada), 2001.; Publication No. AAINQ68156; ISBN: 9780612681569; Source: Dissertation Abstracts International, vol. 63-05, Section: B, p. 2444.; 281.

Document relating to International Application No. PCT/CA2018/050929, dated Nov. 14, 2018 (International Search Report and Written Opinion.

USPTO. Document relating to co-pending U.S. Appl. No. 16/653,036, "Notice of Allowance and Notice of References Cited," dated Jul. 21, 2021, 14 pages.

* cited by examiner

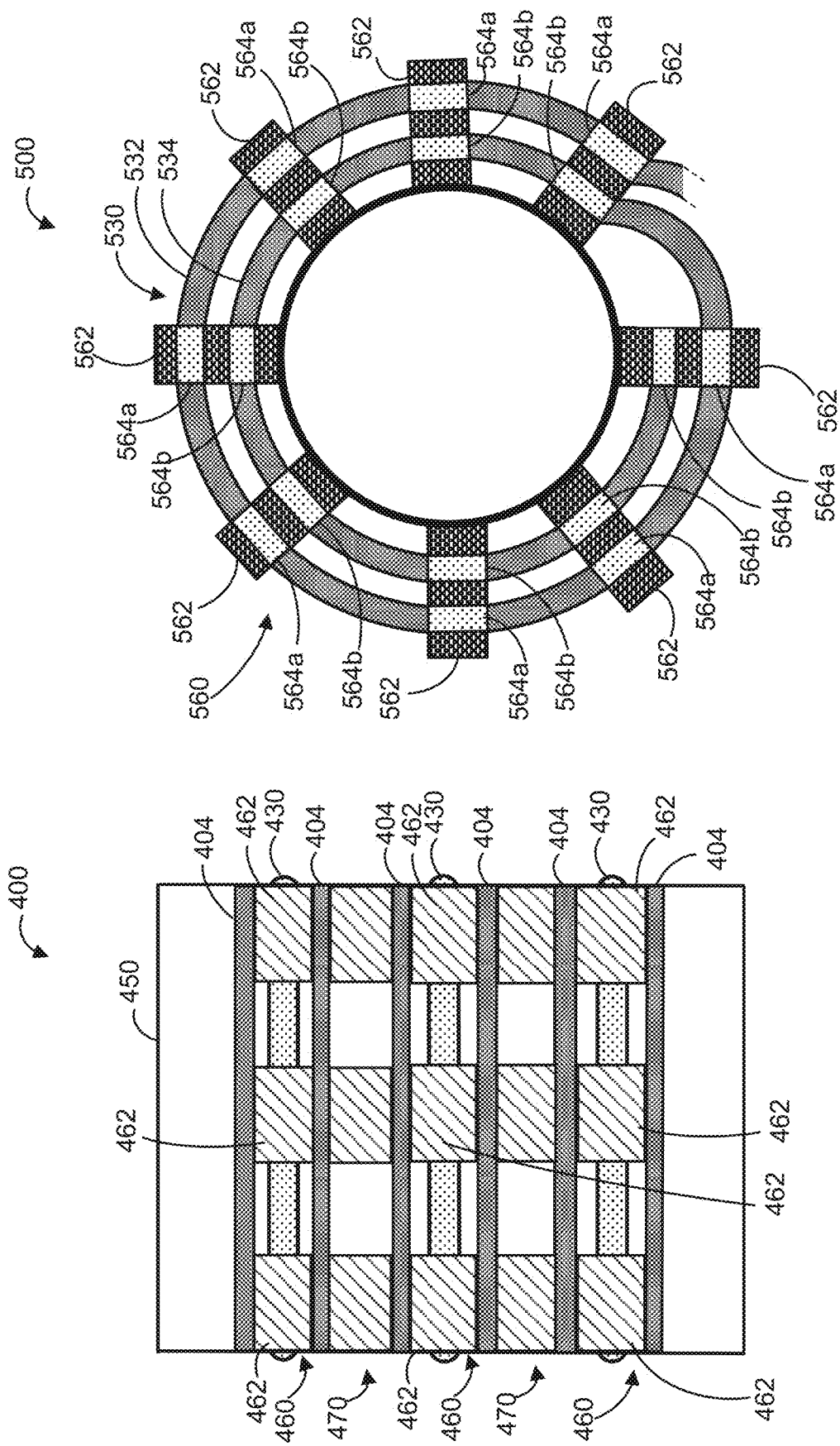

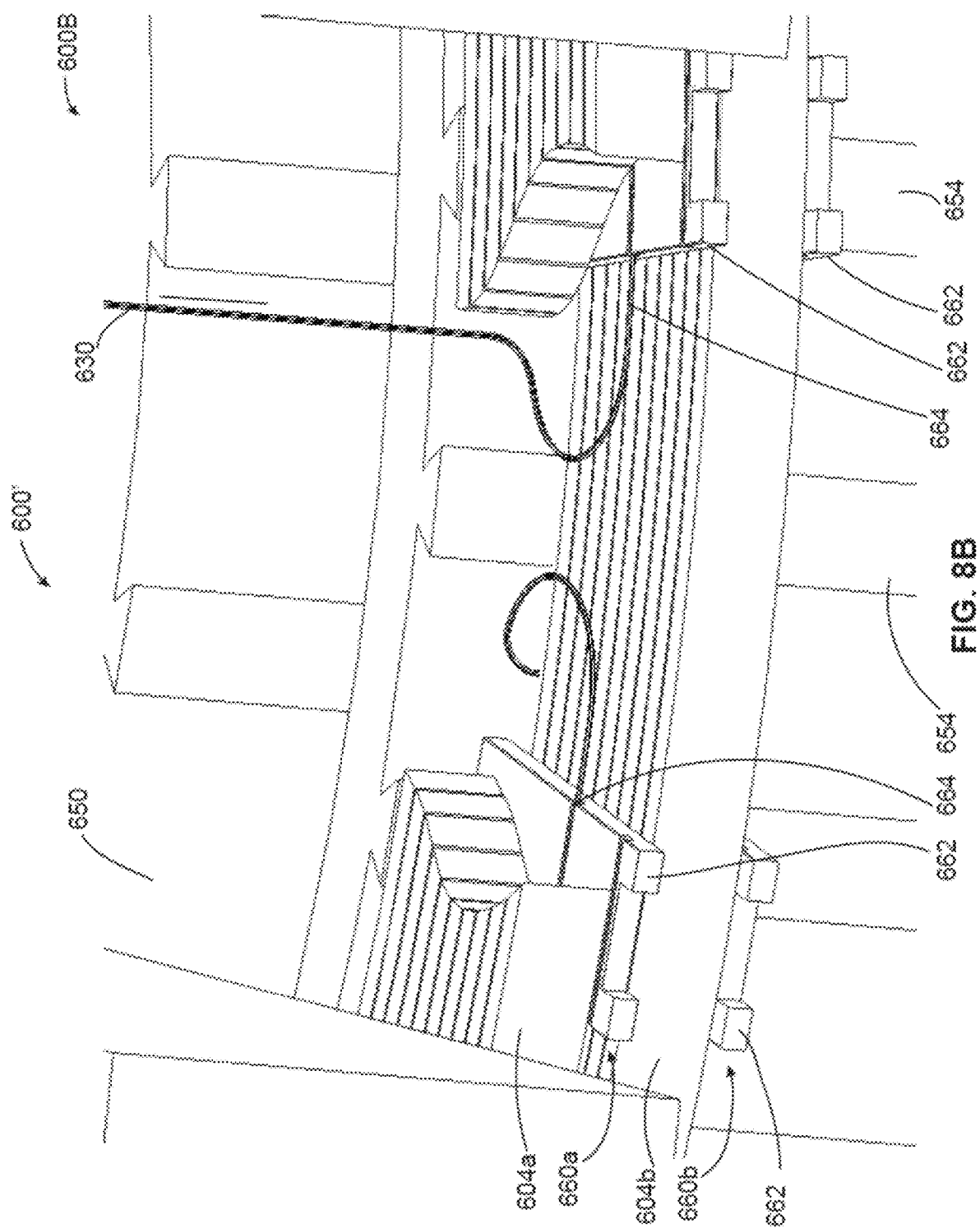

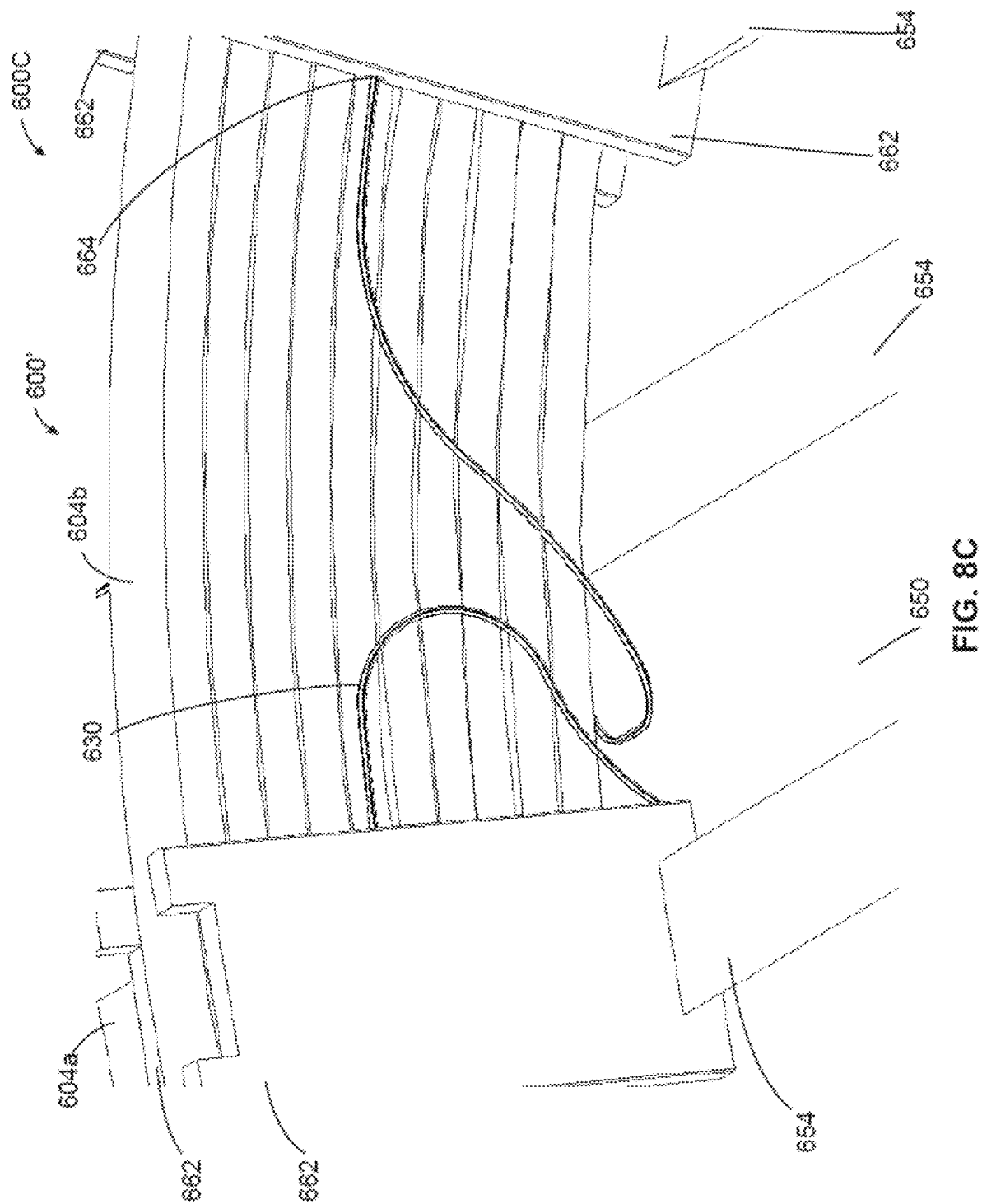

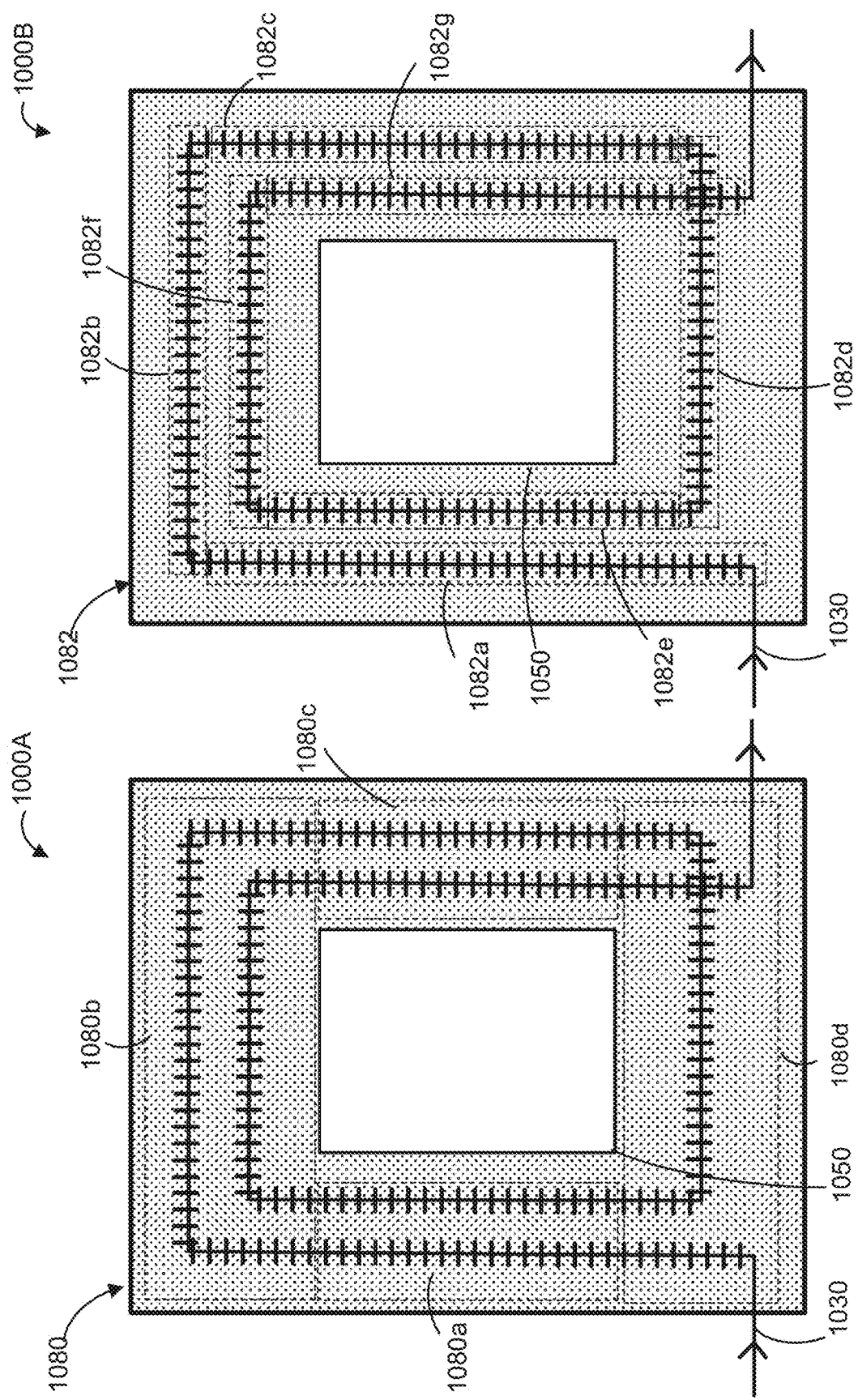

OPTICAL SENSING METHODS AND SYSTEMS FOR TRANSFORMERS, AND THE CONSTRUCTION THEREOF

CROSS REFERENCE TO RELATED APPLICATIONS

This application claims the benefit of U.S. Provisional Application No. 62/539,766 filed on Aug. 1, 2017, which is incorporated by reference herein in its entirety.

FIELD

The described embodiments relate to sensing methods, and systems thereof, for transformers, and the construction thereof. In particular, at least some of the described methods and systems are directed to sensing the operating conditions within a transformer.

BACKGROUND

Faults within a transformer system, such as a power system or reactor system, can be difficult to detect in a timely manner. Faults at a transformer can be caused by physical breakdowns, design flaws, and electrical and/or magnetic flux fluctuations resulting from temperature variation (e.g., hot spots) and/or physical stress. These faults can occur deep within the transformers and can occur fairly quickly, possibly even within minutes. These faults can cause significant failures within the transformer system and can even cause the system to explode.

Point sensors can be embedded within the transformer system for detecting operating condition(s) at a specific location. To capture sufficient data to represent the operating condition of the overall system, a significant number of point sensors are required to be installed throughout the system. A detection range of the point sensors can be limited and so, point sensors may not detect nearby faults if they occur outside the spatial detection range.

SUMMARY

The various embodiments described herein generally relate to sensing methods, systems and the construction thereof.

In accordance with some embodiments, a transformer system includes: a core having: a bottom plate; two or more limbs mounted to the bottom plate; and a top plate mounted to the two or more limbs to enclose the core, wherein at least one of the bottom plate, the top plate and a limb is formed with a sensing component therein; and a winding assembly wound around each respective limb.

In some embodiments, the at least one of the bottom plate, the top plate and the limb includes at least one sensing layer within a stack of laminated layers, each sensing layer including a spacer layer with the sensing component mounted therein; and an electrical coupling between laminated layers neighboring the sensing layer.

In some embodiments, the at least one sensing layer includes a sensing layer, and the sensing layer is positioned at a substantially central position within the stack of laminated layers.

In some embodiments, the at least one sensing layer includes two or more sensing layers, and the two or more sensing layers are distributed substantially equidistant from each other within the stack of laminated layers.

In some embodiments, each sensing layer includes: the spacer layer with a path defined therein; and the sensing component mounted within the path.

In some embodiments, the path extends along a length and/or a width of the spacer layer.

In some embodiments, at least a portion of the path includes an oscillating pattern.

In some embodiments, the sensing component includes an optical fiber.

In accordance with some embodiments, a method of constructing a core for a transformer system includes: forming a core sensing element by: mounting a sensing component to a spacer layer to form a sensing layer; compressing the sensing layer within a stack of laminated layers; and providing an electrical coupling between laminated layers neighboring the sensing layer; and assembling the core using at least one core sensing element.

In some embodiments, mounting the sensing component to the spacer layer includes: defining a path within the spacer layer; and mounting the sensing component within the path.

In some embodiments, defining the path into the spacer layer includes cutting the path into the spacer layer. Methods for cutting the path can include waterjet or other methods, such as laser or with a Computer Numerical Control (CNC) router.

In some embodiments, the method further includes defining the path lengthwise along the spacer layer.

In some embodiments, the method further includes defining a portion of the path to have an oscillating pattern.

In some embodiments, the sensing component includes an optical fiber.

In some embodiments, mounting the sensing component within the path includes: adhering the optical fiber within the path.

In some embodiments, providing the electrical coupling between the laminated layers neighboring the sensing layer includes connecting the neighboring laminated layers with a bridge component.

In some embodiments, forming the core sensing element includes: forming two or more sensing layers; and providing the two or more sensing layers within the stack of laminated layers, wherein each sensing layer is compressed between two neighboring laminated layers.

In some embodiments, the sensing layer is positioned at a substantially central position within the stack of laminated layers.

In some embodiments, the core includes a bottom plate, two or more limbs mounted to the bottom plate, and a top plate mounted to the two or more limbs to enclose the core; and at least one of the bottom plate, a limb and the top plate includes the core sensing element.

In accordance with some embodiments, a method for detecting operating conditions within a transformer includes: mounting a sensing component within a core of the transformer; receiving an input optical signal from an optical source; transmitting a version of the input optical signal to the sensing component, wherein the input optical signal is defined with a carrier frequency at a Brillouin value characterized for the sensing component; receiving a plurality of reflected optical data signals from the sensing component in response to an interaction between the sensing component and the input optical signal; and analyzing the plurality of reflected optical data signals to detect one or more operating conditions within the transformer.

In some embodiments, applying the input optical signal at the Brillouin frequency further includes applying a Brillouin Optical Time Doman Analysis (BOTDA).

In some embodiments, the sensing component includes an optical fiber; and the method includes: forming a core sensing element by: mounting the sensing component to a spacer layer to form a sensing layer; compressing the sensing layer within a stack of laminated layers; and providing an electrical coupling between laminated layers neighboring the sensing layer; assembling the core using at least a core sensing element. The core sensing element can include multiple elements, in some embodiments.

In some embodiments, the method includes: organizing the sensing component into a plurality of zones; and analyzing the plurality of reflected optical data signals to detect the one or more operating conditions within the transformer includes: receiving a selection of one or more zones from the plurality of zones; identifying a set of reflected optical data signals from the plurality of the reflected optical data signals received from the one or more zones within the sensing component; and conducting an analysis of the selected set of reflected optical data signals to determine the one or more operating conditions at the one or more zones.

In some embodiments, analyzing the plurality of reflected optical data signals to detect the one or more operating conditions within the transformer includes: detecting a variation in at least one of the one or more operating conditions within the transformer.

In accordance with some embodiments, a system for detecting operating conditions within a transformer includes: a sensing component mounted within a core of the transformer; an optical signal processing component for: receiving an input optical signal from an optical source; transmitting a version of the input optical signal to the sensing component, wherein the version of the input optical signal is defined with a carrier frequency at a Brillouin value characterized for the sensing component; and receiving a plurality of reflected optical data signals from the sensing component in response to an interaction between the sensing component and the version of the input optical signal; and a processor for analyzing the plurality of reflected optical data signals to detect one or more operating conditions within the transformer.

In some embodiments, the optical signal processing component applies Brillouin Optical Time Doman Analysis (BOTDA).

In some embodiments, the sensing component includes an optical fiber; and the core has: a bottom plate; two or more limbs mounted to the bottom plate; and a top plate mounted to the two or more limbs to enclose the core, wherein at least one of the bottom plate, the top plate and a limb is formed with a sensing component therein.

In some embodiments, the processor operates to detect a variation in at least one of the one or more operating conditions within the transformer.

In accordance with some embodiments, a method of constructing a winding assembly includes: forming a sensing coil, the sensing coil including: a lower coil portion with a lower groove defined therein, an upper coil portion with an upper groove defined therein, and a bonding layer coupling the lower coil portion with the upper coil portion, wherein the lower and upper grooves form a passage for receiving a sensing component; and winding the sensing coil onto a coil former.

In some embodiments, the sensing component includes an optical fiber.

In some embodiments, the coil former includes one of a former and a core of a transformer.

In some embodiments, each of the lower groove and upper groove is formed at a substantially central position of the respective lower and upper coil portions.

BRIEF DESCRIPTION OF THE DRAWINGS

Several embodiments will now be described in detail with reference to the drawings, in which:

FIG. 6 is a side view of a winding assembly in accordance with another example embodiment;

FIG. 7 is a top cross-sectional view of a winding assembly in accordance with another example embodiment;

FIG. 8B is a partial perspective view of the partially constructed winding assembly shown in FIG. 8A at a later stage of construction and with a portion of a coil cut out;

FIG. 8C is a partial perspective view taken from the bottom of the partially constructed winding assembly shown in FIG. 8B;

FIG. 12A is a diagram representing a winding assembly from a top cross-sectional view in accordance with an example embodiment;

FIG. 12B is a diagram representing a winding assembly from a top cross-sectional view in accordance with another example embodiment;

Figure 1:
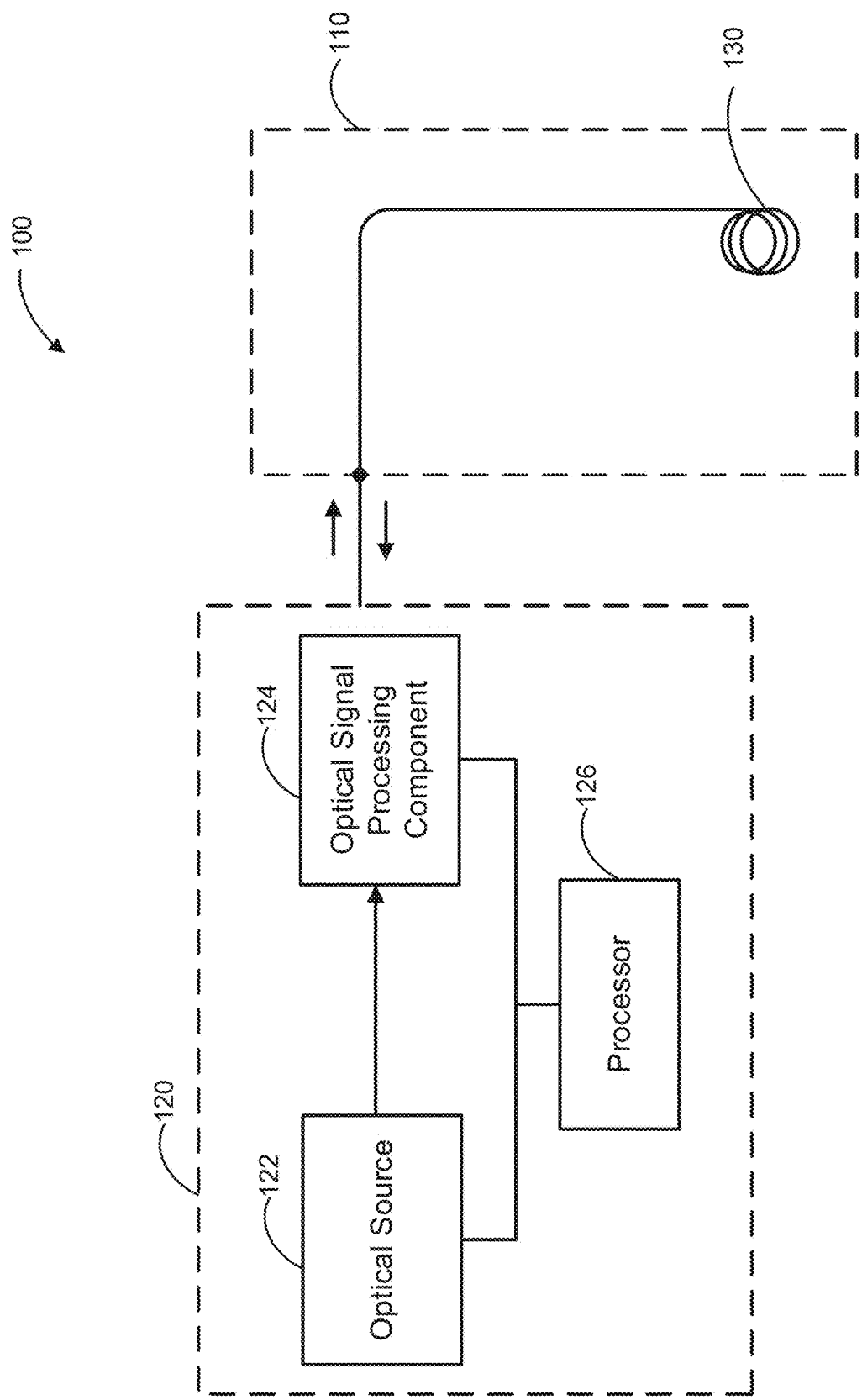
FIG. 1 is a block diagram of an optical sensing system in accordance with an example embodiment.

The drawings, described below, are provided for purposes of illustration, and not of limitation, of the aspects and features of various examples of embodiments described herein. For simplicity and clarity of illustration, elements shown in the drawings have not necessarily been drawn to scale. The dimensions of some of the elements may be exaggerated relative to other elements for clarity. It will be appreciated that for simplicity and clarity of illustration, where considered appropriate, reference numerals may be repeated among the drawings to indicate corresponding or analogous elements or steps.

DETAILED DESCRIPTION OF EXAMPLE EMBODIMENTS

During operation, an internal environment of a transformer can change quickly and faults can occur rapidly. Faults within a transformer can be caused by physical breakdowns, design flaws, and electrical and/or magnetic flux fluctuations resulting from temperature variation (e.g., hot spots) and/or physical stress. These faults can cause significant failures within the transformer system and can even cause fire and/or explosions. It is, therefore, important to detect faults inside the transformer within a reasonable time and with a reasonable degree of accuracy with respect to the location of the fault. The internal environment of the transformer can also be harsh due to the exposure to corrosive chemicals. The sensing systems described herein can facilitate the detection of these faults.

The transformers described herein include any high voltage devices formed of a core and windings. Example transformer systems can include power systems in which the transformer operate to convert voltage and reactor systems in which the transformer operates to absorb a portion of the reactive power.

Reference is made to FIG. 1, which illustrates a block diagram of an optical sensing system 100.

The optical sensing system 100 includes a control system 120 and a sensing component 110. The sensing component 110 can include an optical fiber 130. The optical fiber 130 may be coupled with a reflector at an end away from the control system 120.

The control system 120 can apply Brillouin Optical Time-Domain Analysis (BOTDA) for monitoring operating conditions at the sensing component 110. When applying Brillouin Optical Time-Domain Analysis (BOTDA) to optical devices, such as the optical fiber 130, a shift within the Brillouin spectrum can represent a temperature and/or strain change at the optical fiber 130.

The control system 120 includes an optical source 122, an optical signal processing component 124 and a processor 126. As shown, the processor 126 is in communication with the optical source 122 and the optical signal processing component 124.

The optical source 122 can generate an input optical signal that will travel within the sensing component 110. For example, the optical source 122 can include a laser that can generate a continuous output beam, or a continuous wave. The input optical signal generated by the optical source 122 is then directed to the optical signal processing component 124. Example optical sources 122 can include a tunable laser source, and a laser diode paired with an optical filter. The optical filter may be tunable.

As shown in FIG. 1, the optical signal processing component 124 receives the input optical signal from the optical source 122. The optical signal processing component 124 can preprocess the input optical signal before transmitting a processed optical signal to the sensing component 110.

The optical signal processing component 124 can include an optic modulator that can include an electro-optic modulator and/or an acousto-optic modulator for modulating the input optical signal. The operation of the optic modulator can be controlled by the processor 126. For example, the processor 126 can define a modulation to be applied to the input optical signal and can then transmit a corresponding modulation signal to a pulse conditioning component. The pulse conditioning component can then generate modulation control signals for triggering the operation of the electro-optic modulator. In some embodiments, the pulse conditioning component can also include a microwave generator and a DC bias component.

The DC bias component can define certain properties of the modulated optical signal, such as a duration of the signal. For example, the DC bias component can be pulsed at low frequency, such as a frequency within the kilohertz range, to define the duration of the spacing between the pulses to be longer than a time of flight within the optical fiber 130. In this way, there will be no confusion between the various sets of optical data signals returning from the optical fiber 130.

In some embodiments, an optical filter can receive the input optical signal from the optical source 122 for varying the input optical signal. The optical filter can reduce broadband noise from the optical source 122. The optical filter can, in some embodiments, filter the input optical signal so that only the Brillouin reflection remains. For example, a Bragg filter can be included so that it passes only the Brillouin reflection component of the input optical signal.

An optical amplifier can be included in the optical signal processing component 124, in some embodiments, for amplifying the input optical signal, or a version of the input optical signal. An example optical amplifier includes an Erbium doped fiber amplifier.

The optical signal processing component 124 can include a directional component for directing the transmission of the input optical signal, or a version of the input optical signal, towards the sensing component 110. In some embodiments, the directional component can include an optical isolator that can prevent unwanted feedback. The optical isolator can be positioned before or after the optical filter, the electro-optic modulator, and/or the optical amplifier, in some embodiments.

To facilitate the transmission of the optical signals between the processor 126 and the sensing component 110, the optical signal processing component 124 includes a circulator for directing the processed optical signal towards the sensing component 110, and then directing the optical data signal received from the sensing component 110 towards the processor 126 for analysis.

In the transmission path between the circulator and the processor 126, various post-processing of the optical data signal may be conducted. For example, the optical signal processing component 124 can include an optical filter, such as a Bragg filter, for varying the strength of the optical data signal. Other components, such as a photodetector and an amplifier, can also be included in the optical signal processing component 124 for processing the optical data signal before transmitting a processed optical data signal to the processor 126.

Figure 2A:
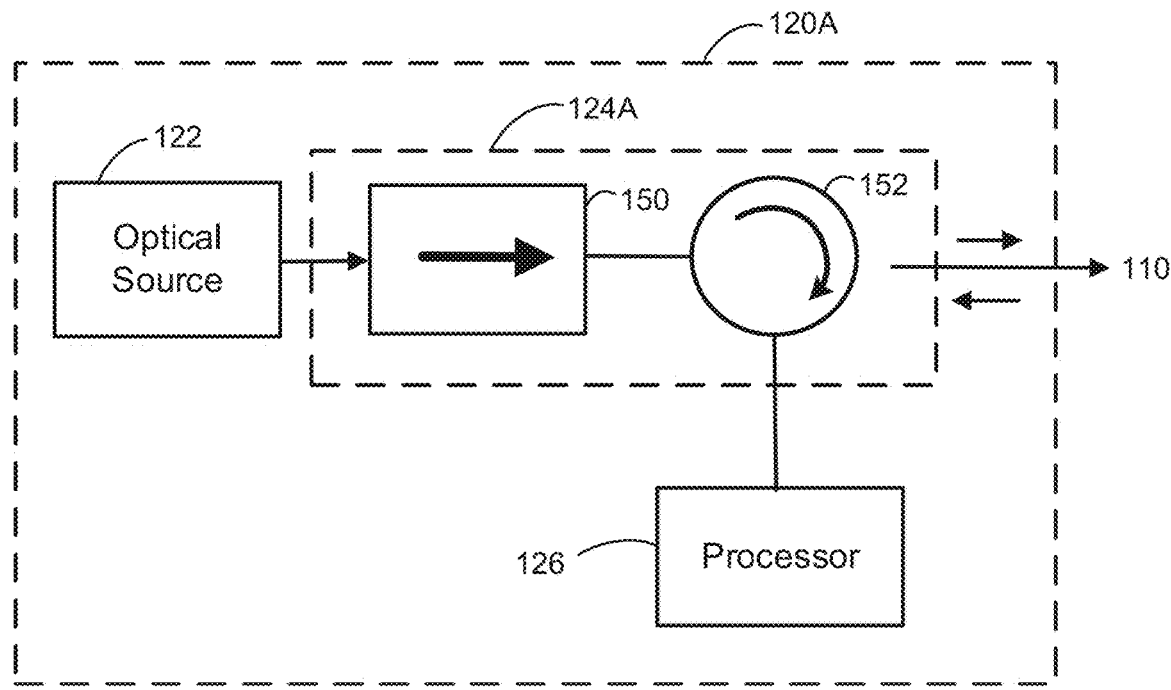
FIG. 2A is a block diagram of a control system in accordance with an example embodiment.
Figure 2B:
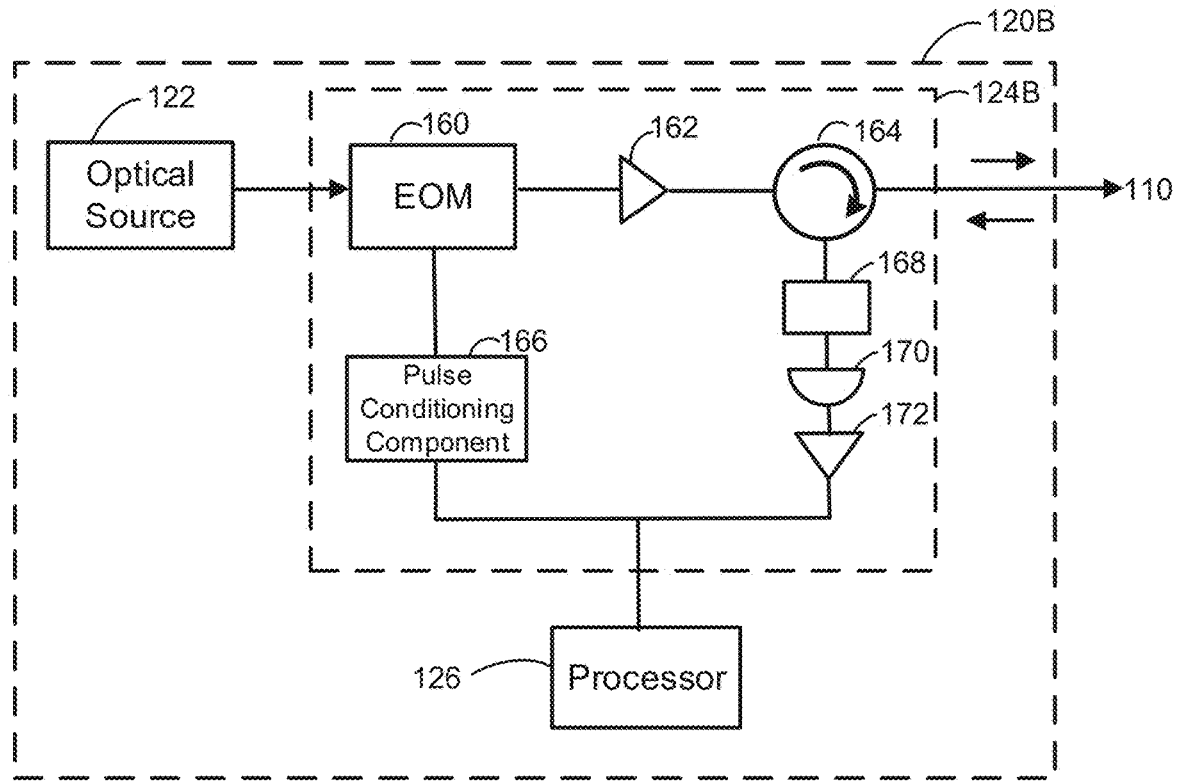
FIG. 2B is a block diagram of a control system in accordance with another example embodiment.

Example implementations of the control system 120 are shown in FIGS. 2A and 2B.

As shown in FIG. 2A, an example control system 120A can include an optical signal processing component 124A with an optical isolator 150 and a circulator 152. The optical isolator 150 can receive an input optical signal from the optical source 122 and direct the input optical signal towards the circulator 152 while preventing unwanted feedback signals from flowing towards the optical source 122. The circulator 152 can then direct the input optical signal towards the sensing component 110, as well as receive optical data signals from the sensing component 110.

FIG. 2B shows another example control system 120B. The control system 120B can include an optical signal processing component 124B as shown. The optical signal processing component 124B can include an electro-optic modulator 160 that receives an input optical signal from the optical source 122.

The optical source 122 can be a continuous wave laser. The laser can be continuously modulated at the desired frequency. The desired frequency can vary between and including 10 GHz to 13 GHz depending on the type of fiber and coating at the fiber. The DC bias component within the pulse conditioning component 166 can also be continuously pulsed within the kilohertz range to generate a low frequency pulses on top of high frequency modulated signal generated by the laser. The modulated laser can generate the Brillouin sidebands (e.g., such as 184a, 184b shown in FIG. 3A) and the low frequency pulses generated by the DC bias component signal allows for the time domain analysis.

The electro-optic modulator 160 can modulate the input optical signal to square laser pulses. The square laser pulses, depending on the intended sensing component 110 and its environment can be within a kilohertz or hertz range. For conducting the Brillouin Optical Time-Domain Analysis (BOTDA), the electro-optic modulator 160 can generate two side bands with an equal frequency shift around the Brillouin frequency (or the main carrier frequency) corresponding to the sensing component 110.

A pulse conditioning component 166 can include a microwave generator for tuning the frequency shift of the sidebands generated by the electro-optic modulator 160. The frequency shift of the sidebands is recorded by the processor 126.

Figure 3A:
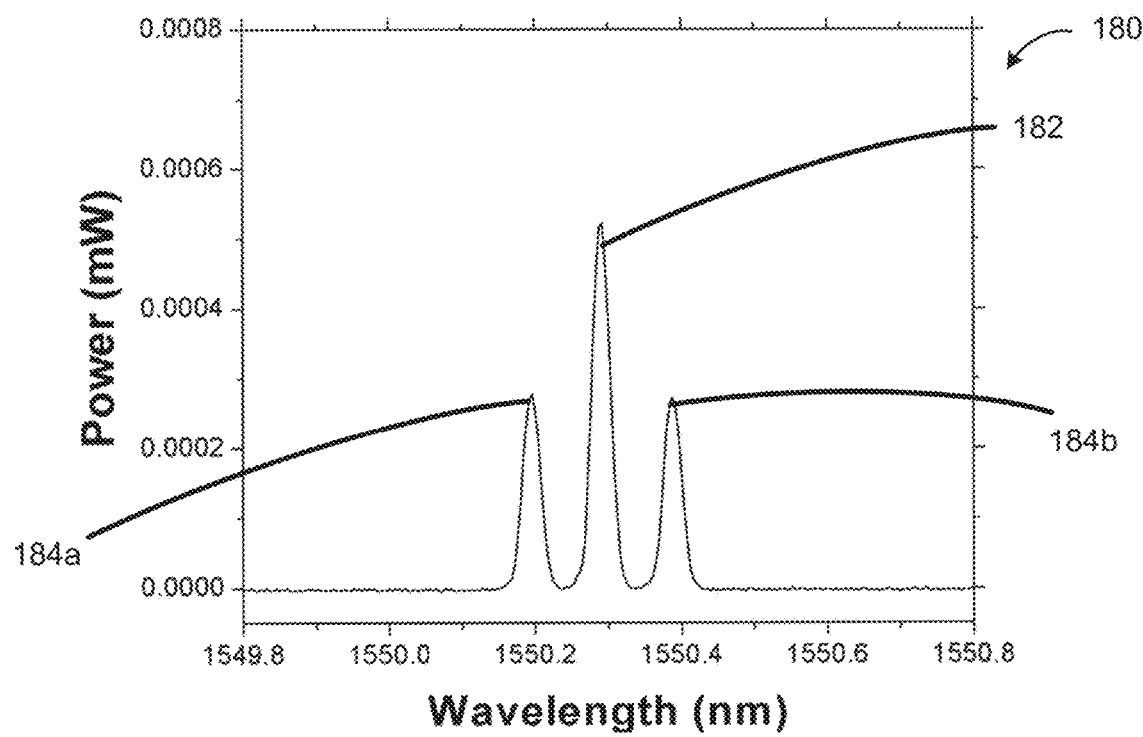
FIG. 3A is a graph showing a waveform generated by the control system in accordance with an example embodiment.

For sensing components 110 in which silica optical fibers are used, the Brillouin frequency is approximately between 10 GHz to 12 GHz. FIG. 3A illustrates an example waveform 180 of a modulated signal generated by the electro-optic modulator 160 for an optical fiber characterized with a Brillouin value of approximately 12 GHz. As shown in FIG. 3A, the modulated signal has three peaks. A main carrier peak 182 is generated by the optical source 122, side peak 184a is the Stokes component of the Brillouin reflection and side peak 184b is the anti-Stokes component.

The electro-optic modulator 160 can then transmit a modulated optical signal towards an optical amplifier 162, which can direct a version of the modulated optical signal towards a circulator 164. From the circulator 164, the version of the modulated optical signal propagates into the sensing component 110. In an optical fiber 130, for example, the pulses of the modulated optical signal within the center frequency (e.g., main carrier peak 182) interact with a back-reflected Stokes sideband. The circulator 164 then receives a reflected data signal and directs the reflected data signal to a photodetector 170.

Figure 3B:
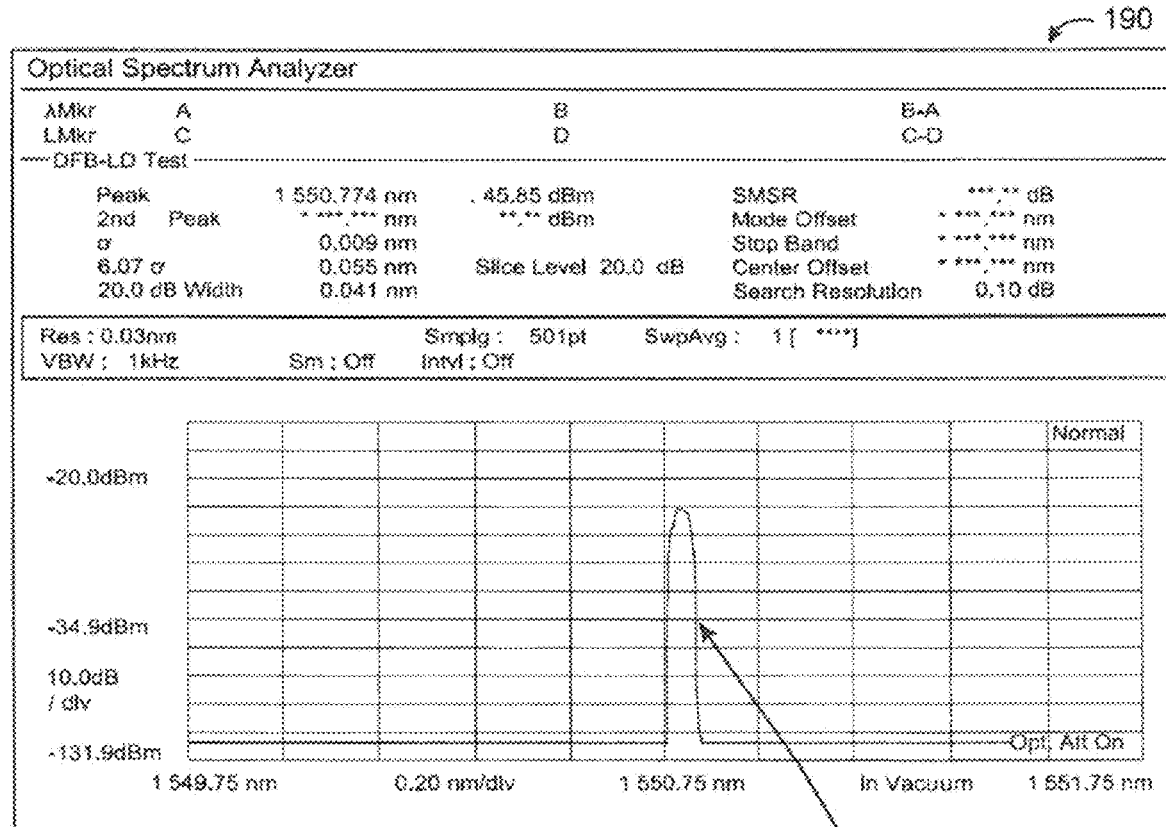
FIG. 3B is a screenshot of a waveform generated by the control system in accordance with another example embodiment.

As shown in FIG. 2B, a filter component 168, such as a Bragg filter, can process the reflected data signal from the optical fiber 130 so that only the optical signal within the Stokes band is transmitted to the processor 126. FIG. 3B shows a screenshot of an example waveform 190 representing a Stokes signal 192 processed by the Bragg filter. An amplifier component 172 can be positioned between the photodetector 170 and the processor 126.

The processor 126 can then record the received Stokes band signal as a function of its frequency shift and time, relative to each of the square laser pulse generated by the electro-optic modulator 160. The time associated with the Stokes signal can also correspond to a distance travelled along the optical fiber 130. Using the recorded Stokes signals, the processor 126 can then spatially resolve an operating condition of the optical fiber 130, such as temperature and/or strain. As a temperature of the optical fiber 130 at a particular region changes, a resulting Stokes signal returning from that region will vary.

By adjusting the RF modulating frequency, the level of the Brillouin response is varied. When the Brillouin signal is affected by external influences, such as temperature, the control system 120 can detect the peak Brillouin response by sweeping the RF frequency to determine a change in temperature or strain.

In some embodiments, the processor 126 can generate a set of three-dimensional time domain waveforms with respect to time, frequency and power to track the temperature of the various regions of the optical fiber 130 with spatial resolution controlled by the optical signal processing component 124 and the processor 126. The operating conditions of the transformer in which the optical fiber 130 is mounted can, thus, also be tracked.

As will be described with reference to FIGS. 4 to 15, the sensing component 110 can be installed within a transformer for monitoring the operating conditions of the transformer.

During operation, the internal environment of the transformer can change quickly and as a result, faults can occur rapidly. These faults can cause significant failures within the transformer system and can even cause fire and/or explosions. It is, therefore, important to detect faults inside the transformer within a reasonable time and with a reasonable degree of accuracy with respect to the location of the fault.

By distributing the optical fiber 130 within the transformer, the detection range of the sensing component can be increased. The optical fiber 130 may, in some embodiments, be wound around a coil former of the transformer more than once. In some embodiments, the optical fiber 130 can be positioned within a core of the transformer. The resulting measurement data collected from each location within the transformer can be increased. The optical fiber 130 is also well insulated and thus, is protected from the corrosive environment.

The construction of the optical sensing system 100 for transformers can include mounting the sensing component 110 to a coil former of the transformer. The coil former can include the core or the former.

In some embodiments, such as those described with reference to FIGS. 4 to 12B, a coil can be wound onto the coil former so that the sensing component 110 becomes positioned within the coil. For example, the coil former can be a structure on which a coil of the transformer is wound, such as a core or the former. In some embodiments, the sensing component 110 can be embedded within the coil former. For example, the sensing component 110 can be positioned within the core.

Figure 4:
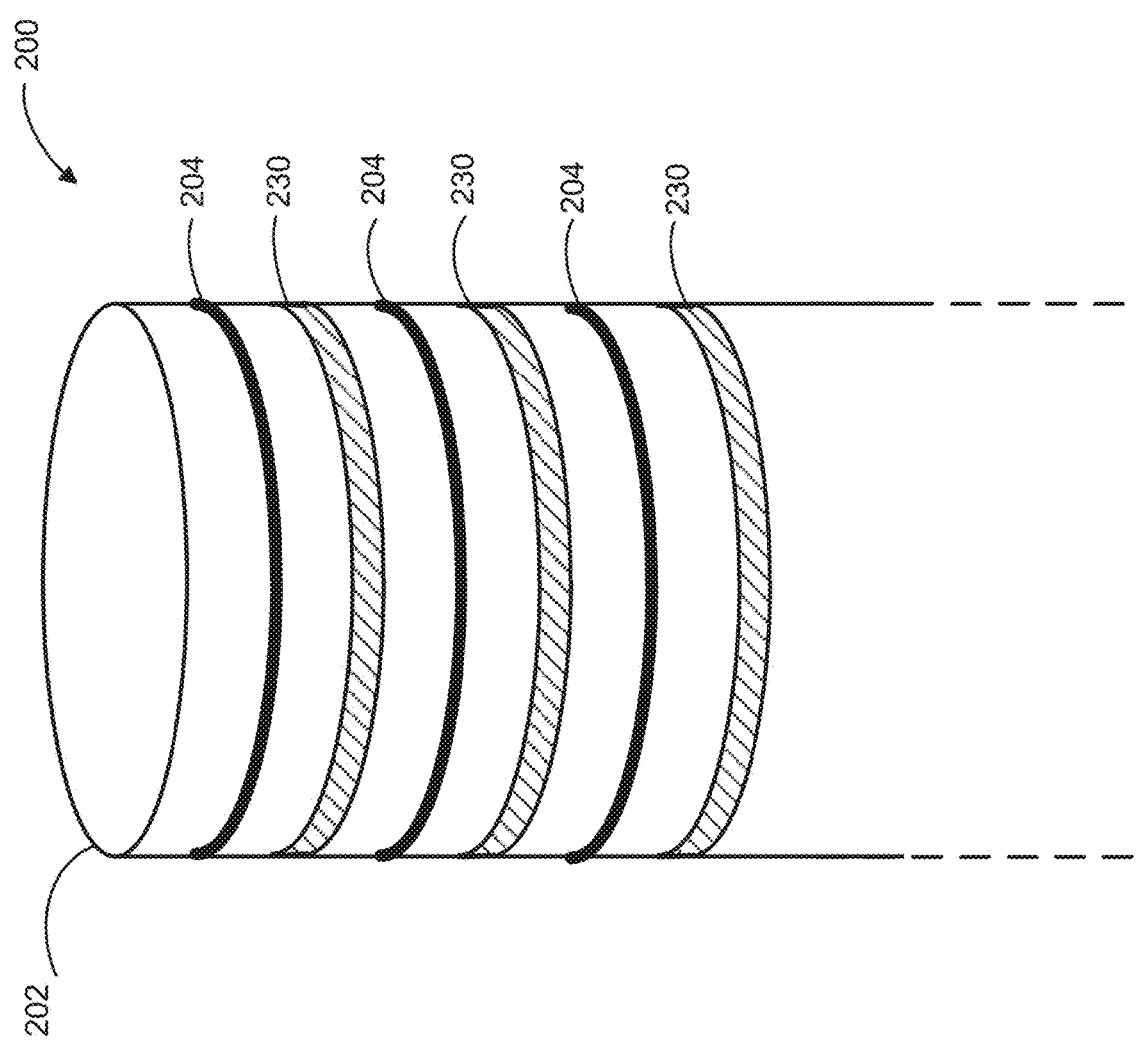
FIG. 4 is a partial perspective view of a partially constructed winding assembly in accordance with an example embodiment.

FIG. 4 is a perspective view of an example partially constructed winding assembly 200.

The winding assembly 200 includes the core 202 around which an optical fiber 230 and a coil 204 are wound. The optical fiber 230, in some embodiments, can be wound to the winding assembly 200 as multiple separate segments. Although multiple turns of the optical fiber 230 is shown in FIG. 4, in some embodiments, the optical fiber 230 can be wound a fewer number of turns around the core 202.

The coil 204 is wound separately from the optical fiber 230. It is possible that the coil 204 is wound closer to the optical fiber 230 so that the turns in each of the optical fiber 230 and coil 204 are closer in proximity to each other and, in some embodiments, even in contact. In FIG. 4, the coil 204 and the optical fiber 230 are alternately wound onto the core 202. In some embodiments, the coil 204 can be wound at one end or either ends of the core 202, or the coil 204 can be wound onto the core 202 at every other turn of the optical fiber 230.

The coil 204 shown in FIG. 4 may be a set of secondary coils. A set of primary coils can be layered on top of the secondary coils to complete the construction of the winding assembly 200.

By winding the optical fiber 230 and coil 204 separately from each other, the cross-section of the optical fiber 230 will not be exposed to the physical pressure exerted onto the transformer as a whole when the core 202 is being assembled. Protecting the optical fiber 230 from physical stress during the construction stage can be important since the optical properties of the optical fiber 230 are dependent on its physical properties. An example transformer will be described with reference to each of FIGS. 10 and 11.

In the example winding assembly 200 shown in FIG. 4 the sensing component 110 is mounted to the core 202. In some embodiments, the sensing component 110 can be embedded within the coil 204 directly.

For example, in a layer winding formation, a flat sheet of conductive material can act as the coil 204. A portion of the coil 204 can be wound to act as the coil former. The sensing component 110 can then be mounted to the initial portion of the coil 204 that is acting as the coil former, and be wound with the remaining portion of the coil 204 onto the coil former to form a winding assembly. The sensing component 110 can be protected by an insulating material, such as tape and/or epoxy.

Figure 13B:
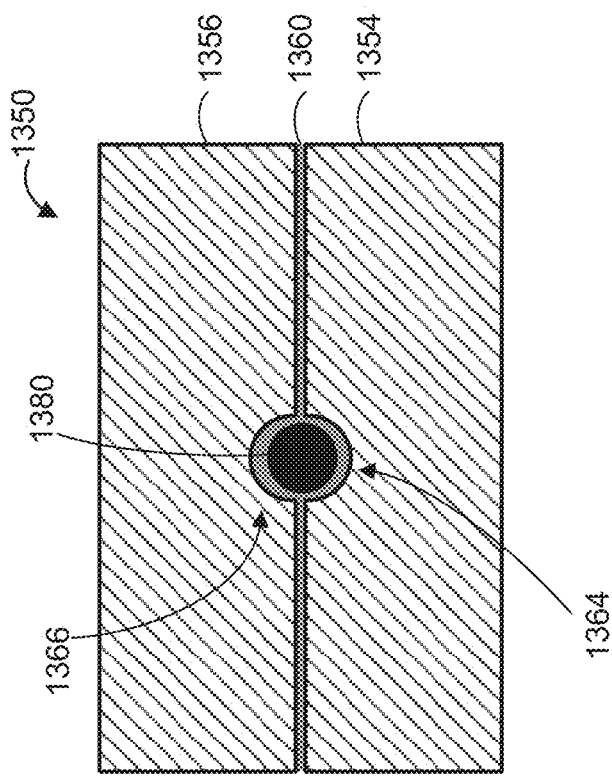
FIG. 13B is a cross-sectional view of another example sensing coil in accordance with another example embodiment.
Figure 13A:
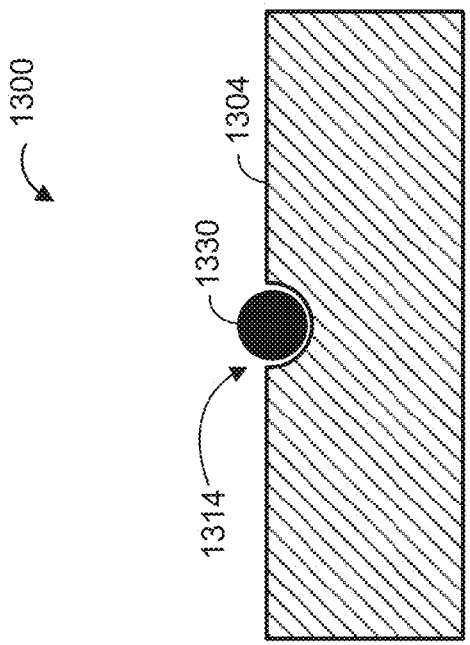
FIG. 13A is a cross-sectional view of an example sensing coil in accordance with an example embodiment.

In some other examples, such as those shown in FIGS. 13A and 13B, the coil 204 can include a groove formed therein for receiving the sensing component 110.

FIG. 13A shows an example sensing coil 1300 in which a coil 1304 has a groove 1314 for receiving an optical fiber 1330. Due to the increased edges at the interface between the groove 1314 and the optical fiber 1330, there will likely be increased turbulent flow at the interface.

FIG. 13B shows another example sensing coil 1350. The sensing coil 1350 includes a lower coil 1354 with a lower groove 1364 for receiving a portion of an optical fiber 1380, and an upper coil 1356 with an upper groove 1366 for receiving the other portion of the optical fiber 1380. The lower and upper grooves 1364 and 1366 can be coupled together to form a passage for the optical fiber 1380. As shown, a bonding layer 1360 can couple the lower coil 1354 with the upper coil 1356.

In comparison with the sensing coil 1300, the structure of the sensing coil 1350 has reduced turbulent flow at the interface between the lower and upper grooves 1364 and 1366 and the optical fiber 1380. The coupling of the lower and upper coils 1354 and 1356 around the optical fiber 1380 also increases the protection of the optical fiber 1380.

In some embodiments described herein, a support element can be mounted to the coil former for supporting the sensing component 110 with respect to the coil 204 and the coil former.

Figure 5B:
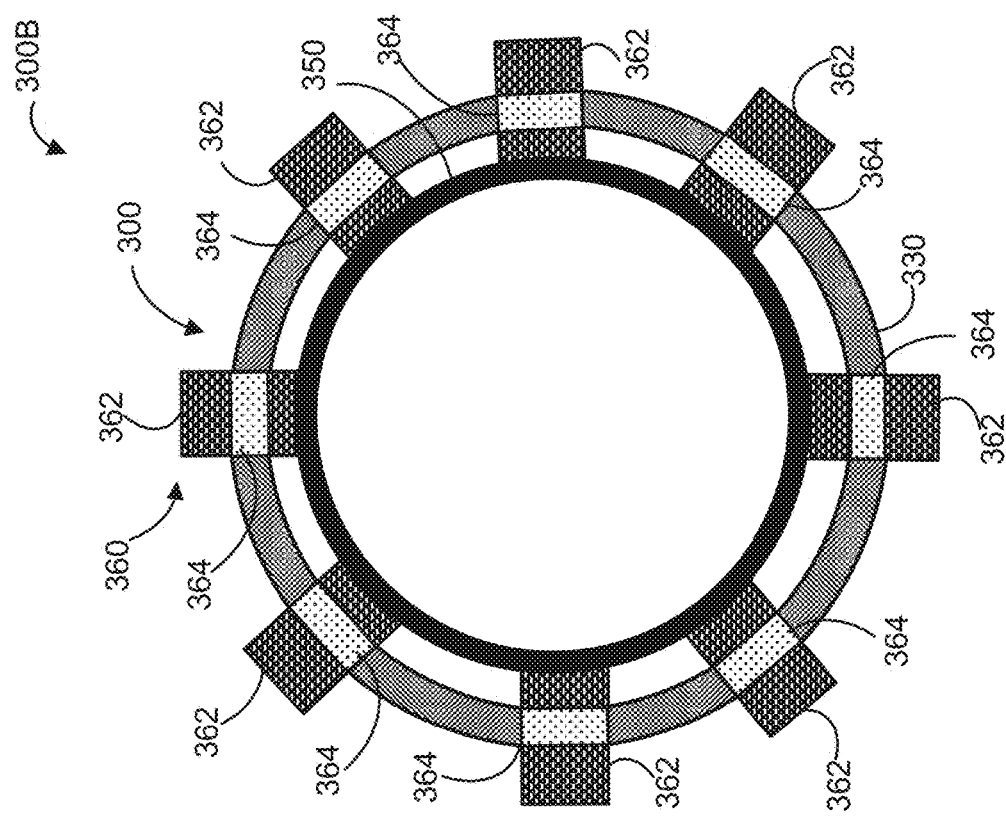
FIG. 5B is a top cross-sectional view of the partially constructed winding assembly shown in FIG. 5A.
Figure 5A:
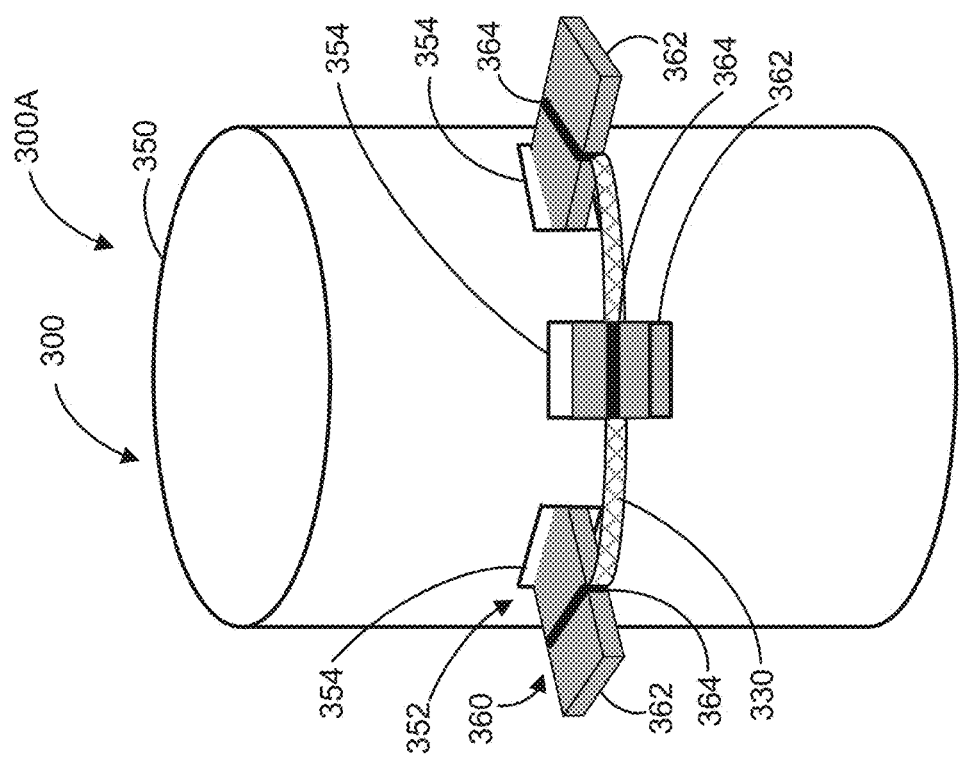
FIG. 5A is a perspective view of a partially constructed winding assembly in accordance with an example embodiment.

FIG. 5A is a perspective view 300A of an example partially constructed winding assembly 300 and FIG. 5B is a top cross-sectional view 300B of the partially constructed winding assembly 300 shown in FIG. 5A. For the example winding assembly 300, the coil former is a former 350.

The partially constructed winding assembly 300 in this example has only been constructed to be wound with one turn of an optical fiber 330. The winding assembly 300 may be constructed with further turns of the optical fiber 330. For winding assemblies 300 constructed with one turn of the optical fiber 330, the optical fiber 330 can be wound at an approximately central location relative to a height of the winding assembly 300.

In the example shown in FIGS. 5A and 5B, a support element is used for positioning the optical fiber 330 with respect to the former 350. The support element includes a set of support spacers, which are shown generally at 360.

The support spacers 362 shown in FIGS. 5A and 5B can be formed from spacers adapted for supporting at least a portion of the sensing component 110. During construction of winding assemblies, spacers can be used to insulate and separate neighboring turns of a coil 204 from each other. Spacers may be formed of pressed paper, in some embodiments. To act as a support element, the support spacer 362 is defined with a spacing 364 for receiving the sensing component 110. The spacing 364 can be formed in various ways and can include a groove, a slot or an opening, for example.

In constructing the winding assembly 300, the former 350 is defined with a plurality of slots, which are shown generally at 352. Each slot 354 within the plurality of slots 352 is adapted to receive a support spacer 362. The slot 354 can be an opening defined in the former 350 for engagingly receiving the support spacer 362. The set of support spacers 360 is mounted to the slots 352.

As shown in FIG. 5A, each support spacer 362 has a spacing 364 for receiving a portion of the optical fiber 330. The optical fiber 330 is positioned away from a surface of the former 350. A coil (not shown) can then be wound onto the former 350 above and below the support spacers 362 to form one or more concentric layers around the former 350. As the coil is wound onto the former 350, the optical fiber 330 becomes positioned within the coil.

FIG. 6 is a side view of an example winding assembly 400.

Similar to the winding assembly 300 shown in FIGS. 5A and 5B, the winding assembly 400 includes a former 450 as the coil former. The support element for positioning the sensing component 110 with respect to the former 450 includes a set of support spacers, which are shown generally at 460. The sensing component 110 includes an optical fiber 430, which is positioned relative to the former 450 via the spacing in each support spacers 462. As shown in FIG. 6, a set of spacers, which are shown generally at 470, are mounted to the former 450 for separating each turn of a coil 404 wound above and below the set of support spacers 460.

FIG. 7 is a top cross-sectional view of an example partially constructed winding assembly 500. The winding assembly 500 includes a former 550 as the coil former, similar to the winding assemblies 300 and 400. However, unlike the winding assembly 300 shown in FIG. 5B, each of the support spacers 562 mounted to the winding assembly 500 is defined with two spacings 564*a* and 564*b* for receiving two corresponding turns, 532 and 534, of the optical fiber 530. In some embodiments, the support spacers 562 can be defined with more than two spacings 564 for receiving more than two corresponding turns of the optical fiber 530.

Figure 8A:
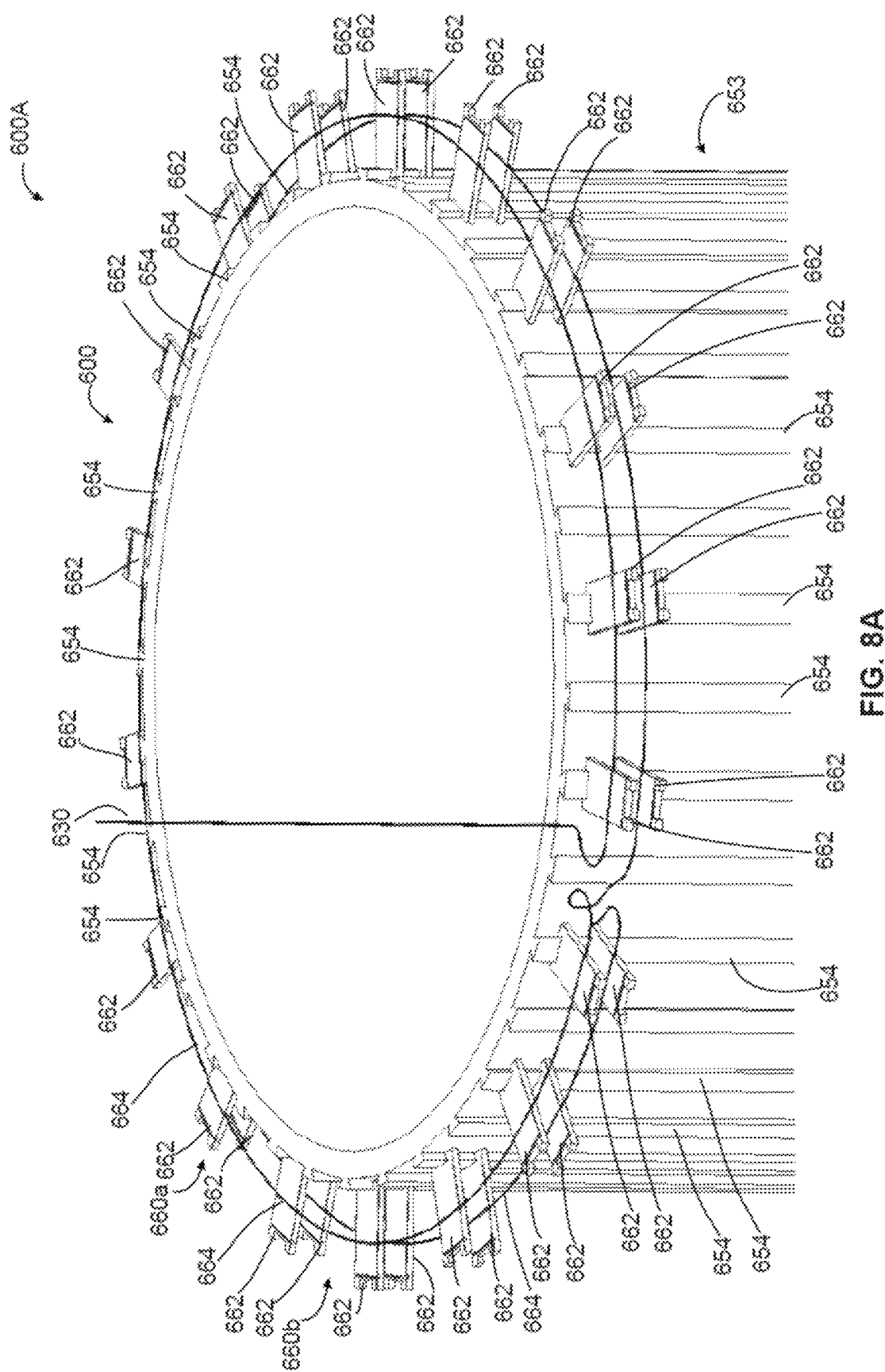
FIG. 8A is a partial perspective view of a partially constructed winding assembly in accordance with another example embodiment.

FIG. 8A is a partial perspective view 600A of an example partially constructed winding assembly 600. The coil former in the winding assembly 600 is a former 650.

Unlike the winding assemblies 300, 400 and 500, the set of support spacers 660 are positioned onto a plurality of ribs, which are shown generally at 653. A first layer of support spacers 660*a* is positioned onto the plurality of ribs 653 and a subsequent layer of support spacers 660*b* is positioned onto the plurality of ribs 653. Although only two layers 660*a*, 660*b* of support spacers 662 are shown in FIG. 8A, more layers of support spacers 662 can be positioned onto the ribs 654, depending on the design parameters of the winding assembly 600.

The plurality of ribs 653 is formed longitudinally on the former 650. Each rib 654, as shown in FIG. 8A, is spaced from each other. Each support spacer 662 is defined with a spacing 664 for receiving a portion of the optical fiber 630.

FIG. 8B is a partial perspective view 600B of the partially constructed winding assembly 600 shown in FIG. 8A at a later stage of construction and with a portion of a layer of the coil 604 cut out, and can be referred to as a version of the partially constructed winding assembly 600'. FIG. 8C shows a partial bottom perspective view 600C of the partially constructed winding assembly 600' shown in FIG. 8B.

As shown in each of FIGS. 8B and 8C, the coil 604 is wound onto the former 650 above and below the support spacers 662. A first layer of the coil 604 is shown at 604*a* and a second layer of the coil 604 is shown at 604*b*. For illustrative purposes, the first layer 604*a* is cut out to show the winding of the optical fiber 630 from the first layer 660*a* to the second layer 660*b*. FIG. 8C illustrates a bottom view of the second layer 660*b* of support spacers 662 and the positioning of the optical fiber 630 with respect to the support spacers 662 and the second layer 604*b* of the coil 604.

In some embodiments, each layer of the coil 604 can include a set of primary coils and a set of secondary coils. The set of primary coils has a different number of turns than the set of secondary coils, and can be wound concentric to the set of secondary coils.

Figure 9A:
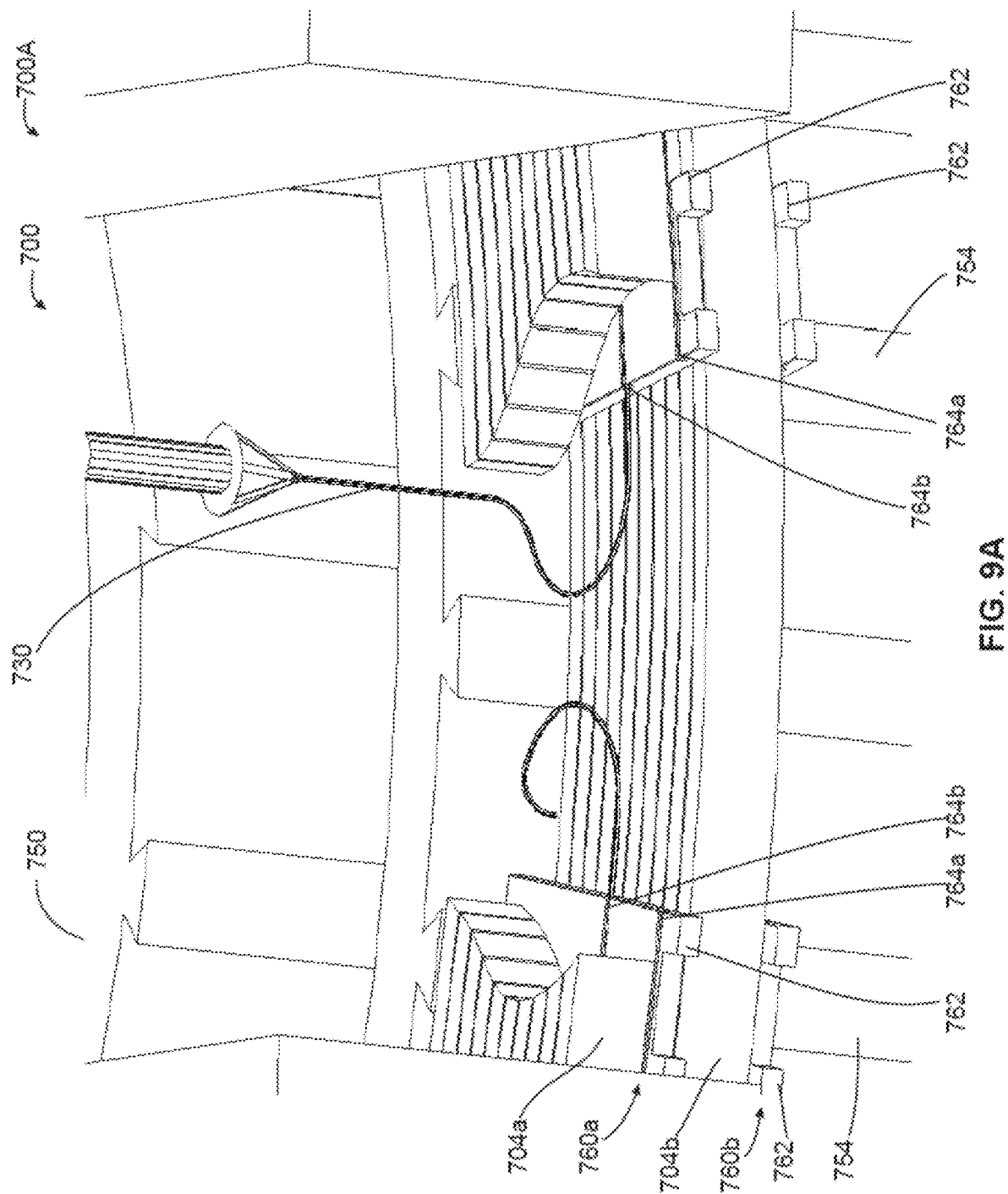
FIG. 9A is a partial perspective view of a partially constructed winding assembly in accordance with another example embodiment.
Figure 9B:
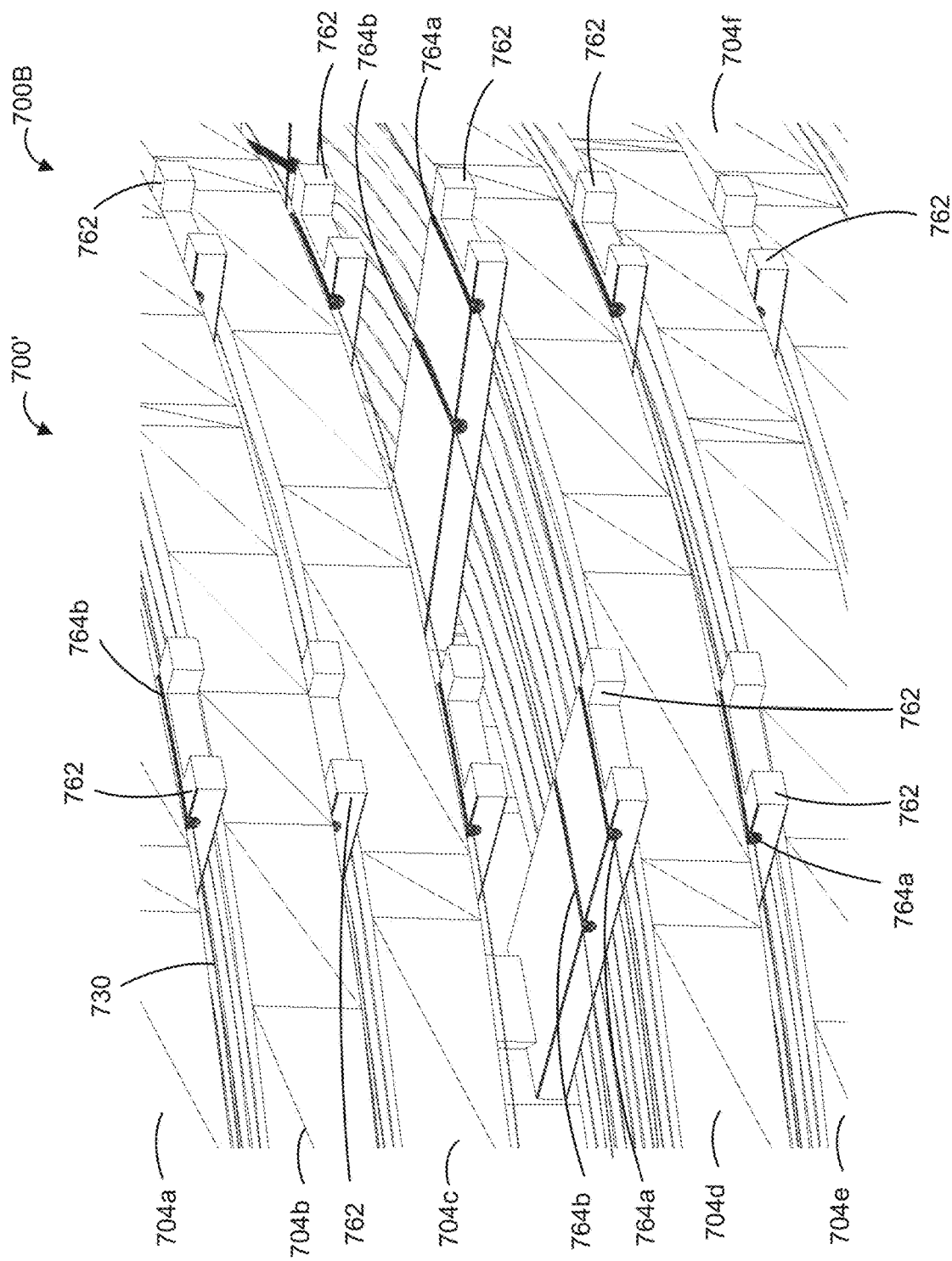
FIG. 9B is a partial perspective view of the partially constructed winding assembly shown in FIG. 9A at a later stage of construction.
Figure 9C:
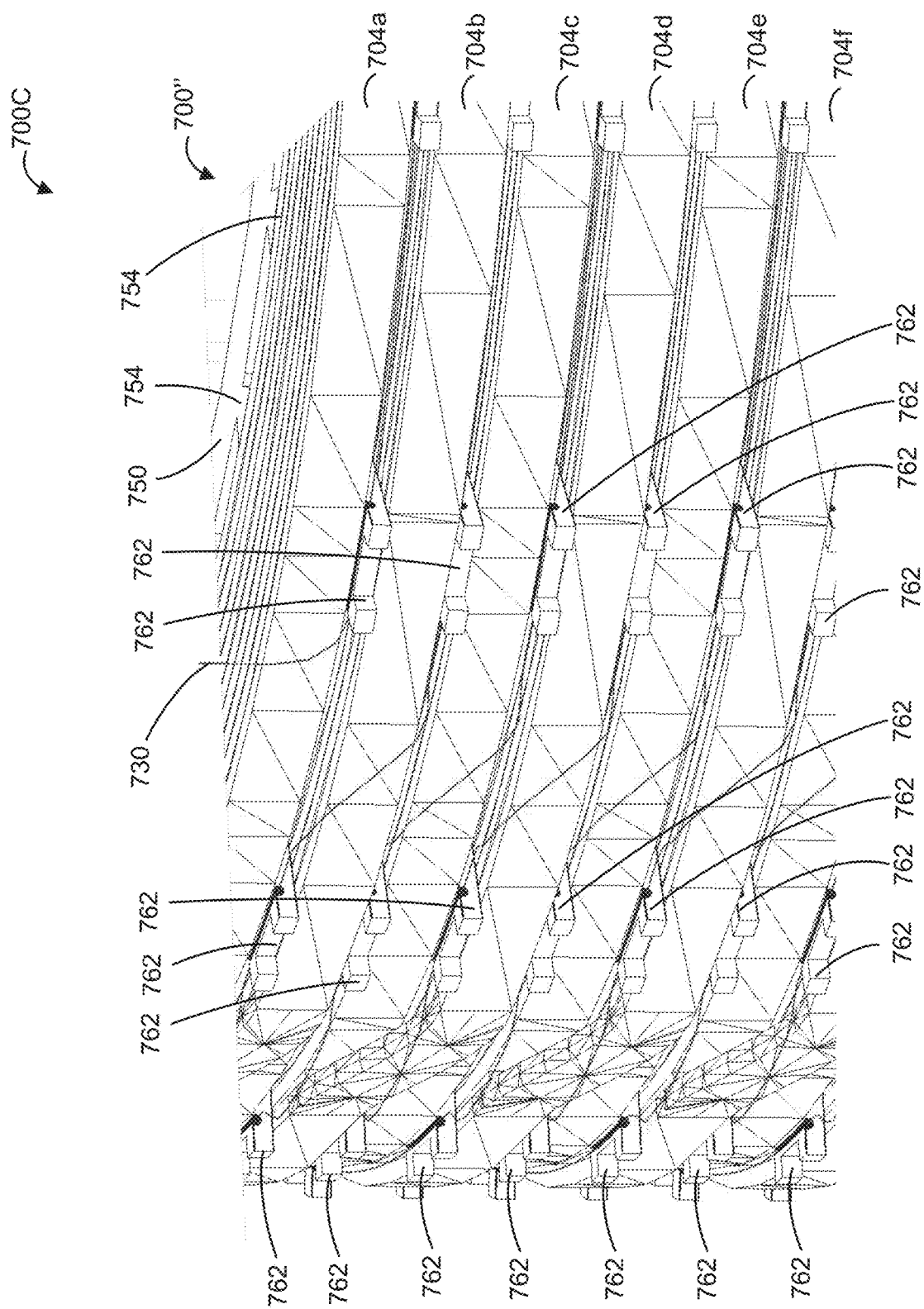
FIG. 9C is a partial perspective view of the partially constructed winding assembly shown in FIG. 9B at a later stage of construction.

FIGS. 9A to 9C show another example winding assembly 700 at different stages of construction. Unlike the winding assembly shown in FIGS. 8A to 8C, the winding assembly 700 (similar to the winding assembly 500 shown in FIG. 7) is constructed with support spacers 762 with two grooves, 764*a* and 764*b*.

FIG. 9A is a partial perspective view 700A of the winding assembly 700. An optical fiber 730 is shown to be positioned onto a groove 764*b* of a support spacer 762 in a first layer 760*a* of support spacers. A second layer 760*b* of support spacers is also shown in FIG. 9A. The first layer 760*a* and second layer 760*b* of support spacers are mounted to some of the ribs 754 on the former 750. Above the first layer 760*a* of support spacers is a first layer 704*a* of coil. A second layer 704*b* of coil is wound between the first layer 760*a* and second layer 760*b* of support spacers.

FIG. 9B is a partial perspective view 700B of the winding assembly 700 at a later stage in construction (which can be referred to as winding assembly 700'). As shown more clearly in FIG. 9B, each of the support spacers 762 includes two grooves 764*a*, 764*b* for receiving two turns of the optical fiber 730. Another partial perspective view 700C of the winding assembly shown in FIGS. 9A and 9B at a later stage of construction is shown in FIG. 9C (which can be referred to as winding assembly 700").

Figure 10:
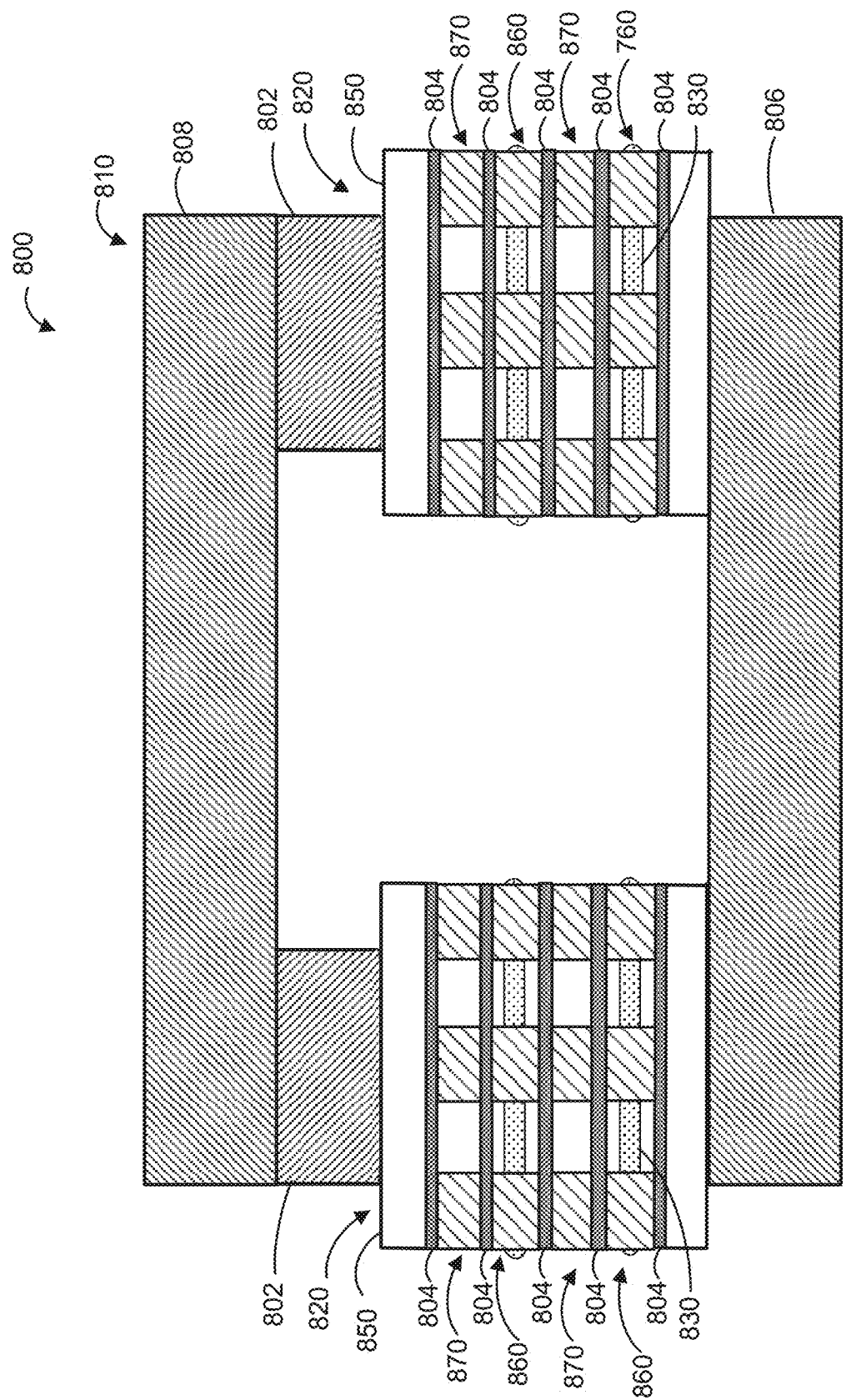
FIG. 10 is a side view of a transformer assembled with two example winding assemblies in accordance with an example embodiment.

FIG. 10 is a side view of an example transformer 800 assembled with two example winding assemblies 820 and a core 810 formed of two limbs 802, a bottom plate 806 and a top plate 808.

The winding assembly 820 includes a former 850 as the coil former, an optical fiber 830 positioned on a set of support spacers 860, and a coil 804 wound onto the former 850 and between a set of spacers 870.

To construct the transformer 800, each winding assembly 820 is fitted through a respective limb 802 and rest on the bottom plate 806. The top plate 808 is then fitted onto the limbs 802 to complete the construction of the transformer 800.

The core 810, in some embodiments, can be formed with the sensing component 110 integrated therein. An example transformer 1400 in which a core 1410 is integrated with the sensing component 110 is now described with reference to FIG. 14A.

Figure 14A:
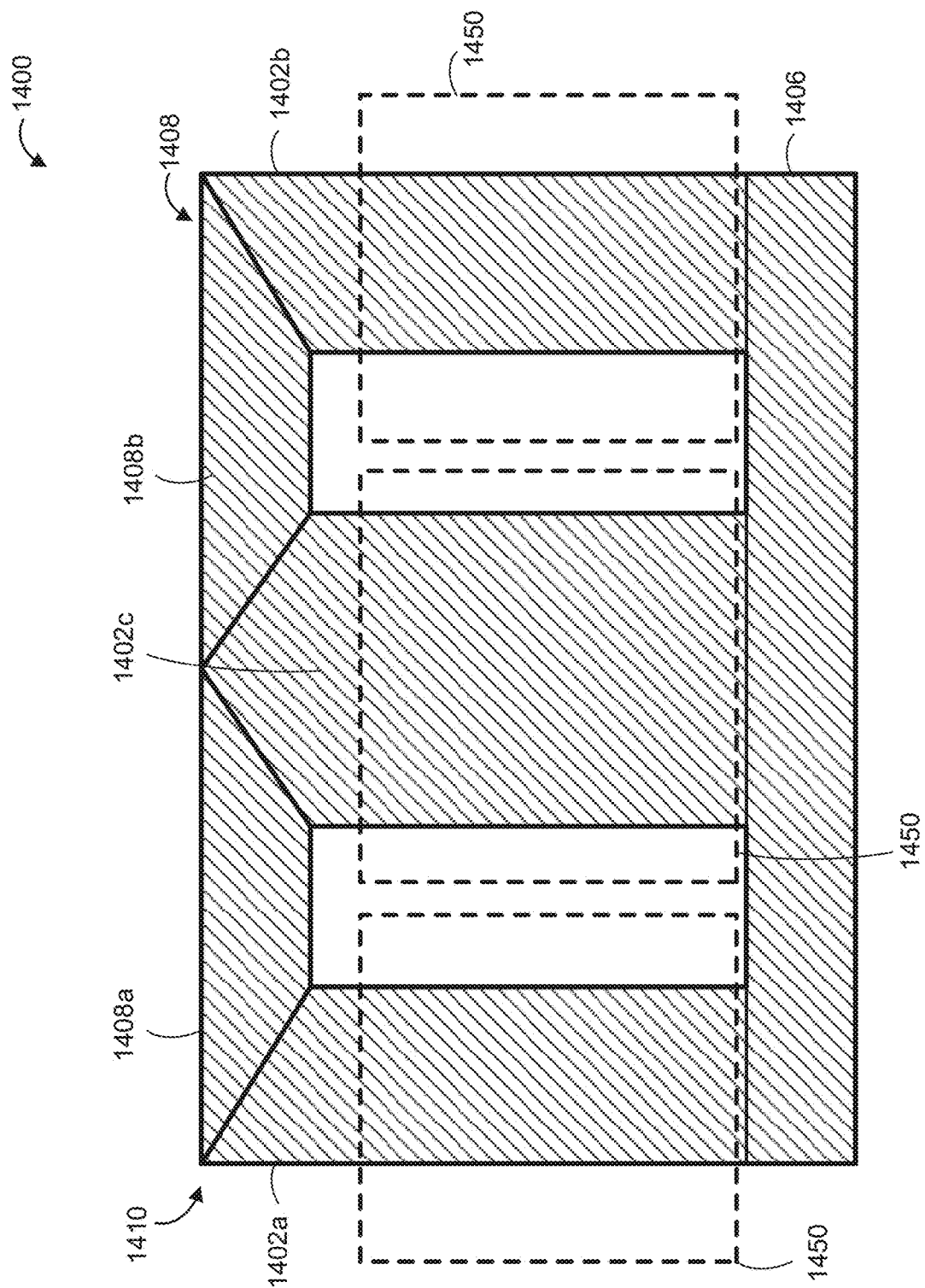
FIG. 14A is a cross-sectional view of a transformer in accordance with another example embodiment.

The transformer 1400 of FIG. 14A includes the core 1410 with three limbs, namely a first outer limb 1402*a*, a second outer limb 1402*b* and a center limb 1402*c*. The limbs 1402*a*, 1402*b*, 1402*c* are mounted to a bottom plate 1406. A top plate 1408 having top plate portions 1408*a* and 1408*b* is mounted to the limbs 1402*a*, 1402*b*, 1402*c* to enclose the core 1410.

For illustrative purposes, only the outline of the formers is shown at 1450. It will be understood that the formers 1450 need to be installed onto the limbs 1402*a*, 1402*b*, 1402*c* prior to assembling the top plate 1408 onto the limbs 1402*a*, 1402*b*, 1402*c*. Although not shown, in some embodiments, the formers 1450 can be provided with any of the formers described herein.

Each of the top plate 1408, the bottom plate 1406 and the limbs 1402*a*, 1402*b* and 1402*c* is assembled by compressing a stack of laminated layers together. One or more of the top plate 1408, the bottom plate 1406 and the limbs 1402*a*, 1402*b* and 1402*c* can be assembled to include a sensing component 110. A core sensing element can refer to any of the top plate 1408, the bottom plate 1406 and the limbs 1402*a*, 1402*b* and 1402*c* that is assembled with a sensing component 110.

Figure 14D:
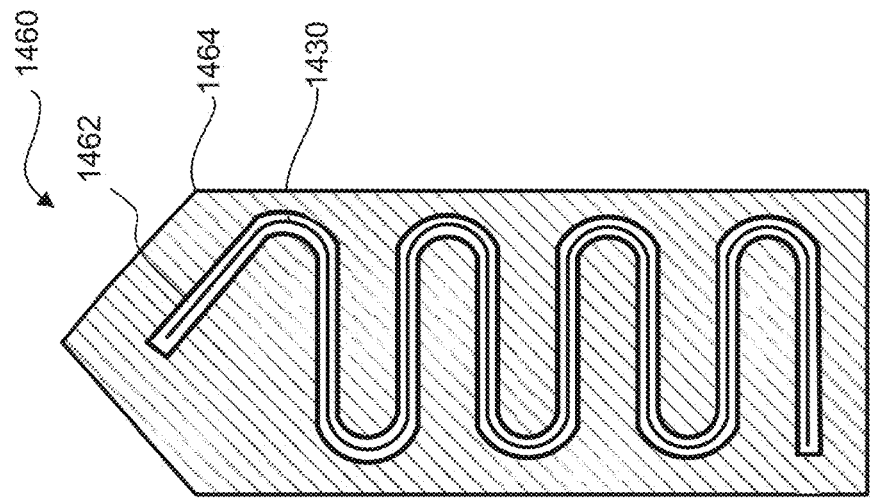
FIG. 14D is a front view of a sensing layer for the center limb shown in FIG. 14B.
Figure 14B:
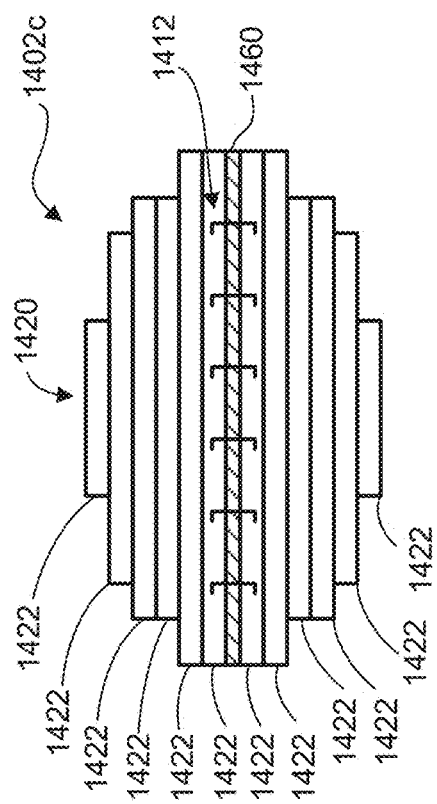
FIG. 14B is a top view of an example center limb for the transformer shown in FIG. 14A.
Figure 14C:
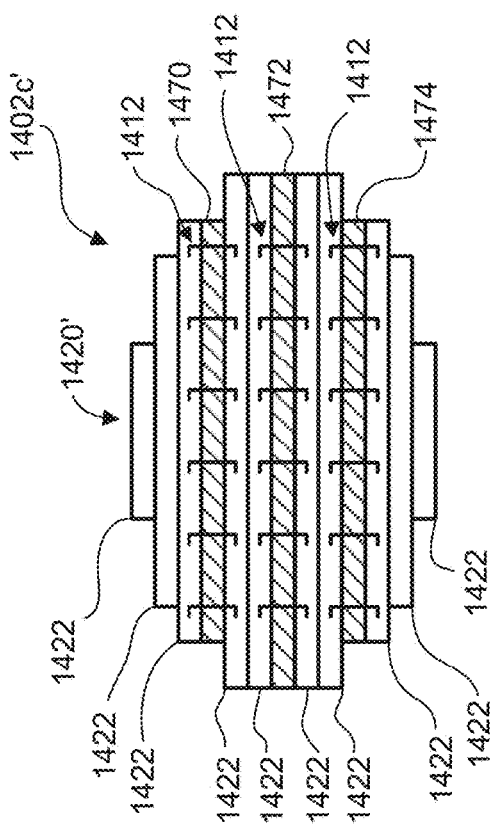
FIG. 14C is a top view of another example center limb for the transformer shown in FIG. 14A.

FIGS. 14B and 14C show a top view of example center limbs 1402*c* and 1402*c'*, respectively.

FIG. 14B is a top view of an example center limb 1402*c*. The center limb 1402*c* is formed by compressing one or more laminated layers 1422 together to form a stack of laminated layers 1420. As shown in FIG. 14B, the stack 1420 includes a sensing layer 1460. The laminated layers 1422 neighboring the sensing layer 1460 are connected with electrical couplings 1412, such as a bridge component.

In the example shown in FIG. 14B, the sensing layer 1460 is positioned at a substantially central position within the stack 1420. In other embodiments, the sensing layer 1460 can be positioned in a different position within the stack 1420. The position of the sensing layer 1460 can vary depending on the intended application of the transformer 1400, such as the area of the transformer 1400 that the optical sensing system 100 is intended to monitor.

In some embodiments, a core sensing element, such as center limb 1402*c* shown in FIG. 14B, can include two or more sensing layers. When multiple sensing layers 1460 are provided, the sensing layers 1460 can be equally distributed within the stack 1420 or variedly distributed depending on the area of the transformer 1400 that the optical sensing system 100 is intended to monitor. Increasing the number of sensing layers 1460 can increase the sensitivity of the measurements collected by the optical sensing system 100. An example core sensing element with multiple sensing layers 1460 will now be described with reference to FIG. 14C.

FIG. 14C is a top view of another example center limb 1402c'. Unlike the center limb 1402c of FIG. 14B, the center limb 1402c' includes three sensing layers 1470, 1472, and 1474 that are relatively equally distributed within the stack 1420'. As shown in FIG. 14C, the laminated layers neighboring each of the sensing layers 1470, 1472, and 1474 is coupled to each other with electrical couplings 1412.

FIG. 14D is a front view of the sensing layer 1460. The sensing layers 1470, 1472, and 1474 can be analogous to the sensing layer 1460 but with scaled dimensions. As shown in FIG. 14D, the sensing layer 1460 is formed by defining a path 1462 within a spacer layer 1464. The spacer layer 1464 can be formed of an insulating material, such as fiberglass. In some embodiments, the spacer layer 1464 can be formed of a non-dielectric material, such as steel, in which case the bridge component may not be necessary.

Example fiberglass can include any fiberglass with a high mechanical strength and high temperature rating (e.g., 130° C. or higher). The spacer layer 1464 can be formed of woven fiberglass cloth with an epoxy resin, in some embodiments. For example, the fiberglass used can include GPO3, Garolite, G10, G11, or similar quality.

When assembling the stacks 1420, 1420', the spacer layer 1464 is placed onto one or more laminated layers 1422 and a sensing component 1430, such as an optical fiber, can then be mounted within the path 1462. The sensing component 1430 can be adhered within the path 1462 with epoxy, for example. Additional laminated layers 1422 are then added on top of the sensing layer 1460, 1470 to form the stacks 1420, 1420', respectively.

The path 1462 extends lengthwise along the sensing layer 1460. As shown in FIG. 14D, a portion of the path 1462 can have an oscillating pattern. It will be understood that other patterns may be used depending on the intended application of the transformer 1400.

Figure 15:
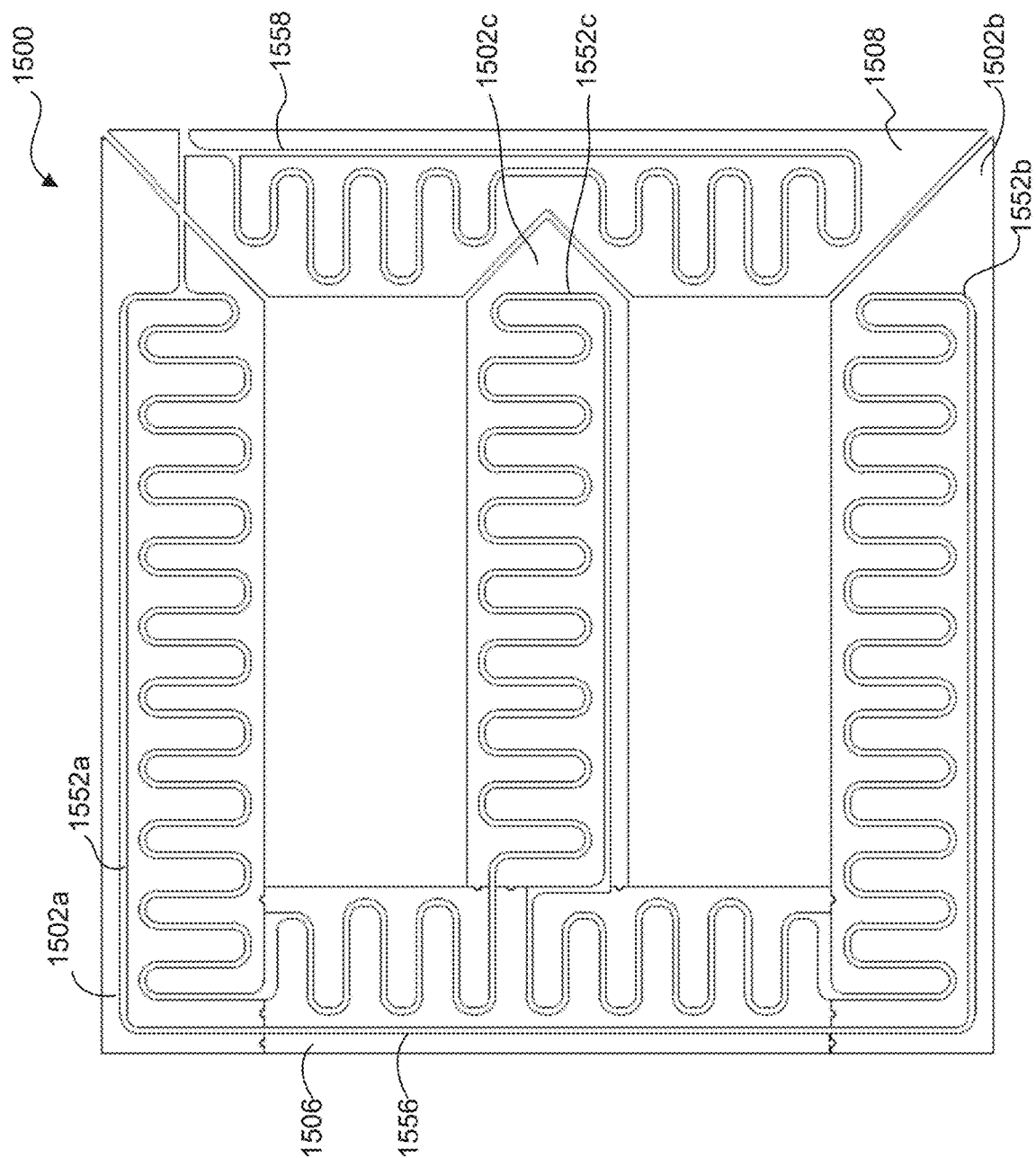
FIG. 15 shows an example template of path patterns for an example transformer.

FIG. 15 shows an example path pattern template 1500 for a core with three limbs, such as the transformer shown in FIG. 14A.

The template 1500 includes a template 1502c with a path pattern 1552c for a center limb, templates 1502a and 1502b with path patterns 1552a and 1552b, respectively, for outer limbs, a template 1506 with a path pattern 1556 for a bottom plate, and a template 1508 with a path pattern 1558 for a top plate. Depending on a diameter of the core, the template 1500 can be scaled accordingly. As shown in FIG. 15, a portion of each of the path patterns 1552a to 1558 includes an oscillating pattern. Other path patterns can be used for forming the core sensing elements. The template 1500 is illustrative of example patterns. Different path patterns may be used depending on the intended application of the transformer 1400.

The path pattern template 1500 can be used as a guide for defining the path patterns 1552a to 1558 into the respective spacer layers. For example, using the template 1500 as a guide, a waterjet cutting technique or other similar techniques can be used to cut the path patterns 1552a to 1558 into the respective spacer layers.

Figure 11:
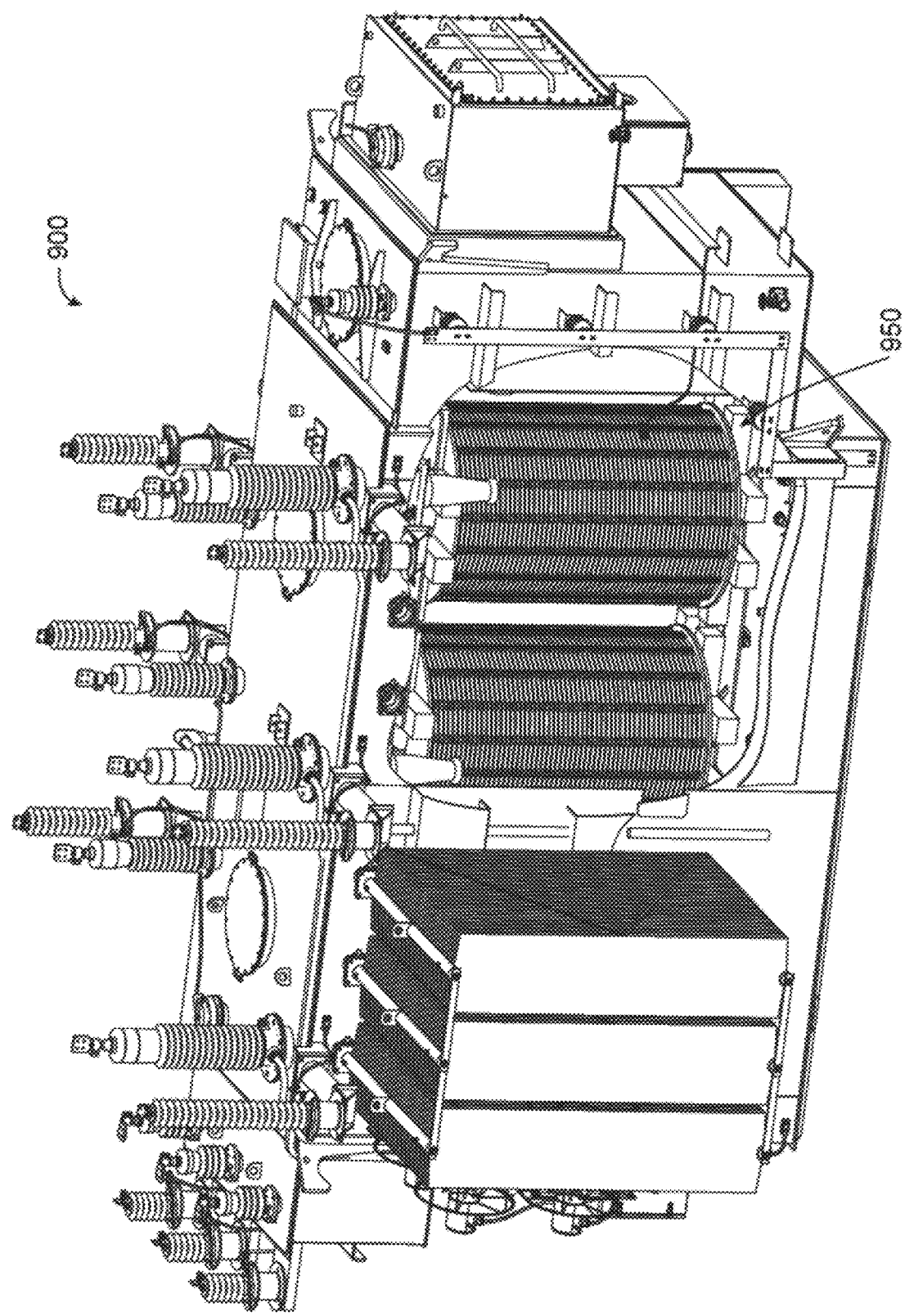
FIG. 11 is a perspective view of an example transformer assembled with example winding assemblies described herein.

FIG. 11 illustrates a perspective view of another example transformer 900 constructed assembled with example winding assemblies 950.

In some embodiments, depending on the design of the transformer 800, 900, the winding assemblies 820, 950 can be differently constructed. For example, the number of turns in the coil may be different, and/or the number of limbs can be different.

For monitoring the operating conditions of the transformer, a sensing component 110 mounted to the transformer can be organized into multiple different zones. The various different zones enable the processor 126 to focus the analysis to certain regions within the transformer. For example, certain regions within the transformer may be more likely to sustain faults, or the operating conditions in those regions are more likely to rapidly change and therefore, require more concentrated monitoring. As a result, the processor 126 may analyze the data signals returning from those regions more frequently than the data signals from other regions. The processing load at the processor 126 can, thus, be redistributed, and unnecessary processing can be minimized.

FIGS. 12A and 12B illustrate different zones that can be defined for the sensing component 110.

FIG. 12A shows a diagram 1000A representing an example winding assembly 1000 from a top cross-sectional view.

The sensing component 110 mounted to the winding assembly 1000 is an optical fiber 1030. The optical fiber 1030 can be wound around a coil former 1050 as shown in FIG. 12A. For tracking the optical data signals received from the optical fiber 1030, the processor 126 can define the optical fiber 1030 into multiple zones 1080 with reference to the cross-sectional area of the coil former 1050. For example, as shown in FIG. 12A, a first zone 1080a can be defined for a first region of the coil former 1050, a second zone 1080b can be defined for a second region of the coil former 1050, a third zone 1080c can be defined for a third region of the coil former 1050, and a fourth zone 1080d can be defined for a fourth region of the coil former 1050.

FIG. 12B shows another diagram 1000B representing the winding assembly 1000.

Unlike the organization of the zones 1080 shown in FIG. 12A, the processor 126 can define the optical fiber 1030 into zones 1082 based on segments of the optical fiber 1030. For example, as shown in FIG. 12B, the processor 126 can define a first segment of the optical fiber 1030 as a first zone 1082a, a second segment of the optical fiber 1030 as a second zone 1082b, a third segment of the optical fiber 1030 as a third zone 1082c, a fourth segment of the optical fiber 1030 as a fourth zone 1082d, a fifth segment of the optical fiber 1030 as a fifth zone 1082e, a sixth segment of the optical fiber 1030 as a sixth zone 1082f, and a seventh segment of the optical fiber 1030 as a seventh zone 1082g.

It will be understood that the size of each of the zones 1080, 1082 can be varied with user preferences and/or design parameters of the overall optical sensing system 100.

It will be appreciated that numerous specific details are described herein in order to provide a thorough understanding of the described example embodiments. However, it will be understood by those of ordinary skill in the art that the embodiments described herein may be practiced without these specific details. In other instances, well-known methods, procedures and components have not been described in detail so as not to obscure the embodiments described herein. Furthermore, this description and the drawings are not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements.

The embodiments of the systems and methods described herein may be implemented in hardware or software, or a combination of both. These embodiments may be implemented in computer programs executing on programmable computers, each computer including at least one processor, a data storage system (including volatile memory or non-volatile memory or other data storage elements or a combination thereof), and at least one communication interface. For example and without limitation, the programmable computers (referred to below as computing devices) may be a server, network appliance, embedded device, computer expansion module, a personal computer, laptop, personal data assistant, cellular telephone, smart-phone device, tablet computer, a wireless device or any other computing device capable of being configured to carry out the methods described herein.

Various embodiments have been described herein by way of example only. Various modification and variations may be made to these example embodiments without departing from the spirit and scope of the invention, which is limited only by the appended claims.

We claim:

1. A transformer system comprising:
a core having:
   a bottom plate;
   two or more limbs mounted to the bottom plate; and
   a top plate mounted to the two or more limbs to enclose the core,
   wherein at least one of the bottom plate, the top plate and a limb is formed with a sensing component therein, and at least one of the bottom plate, the top plate and the limb comprises at least one sensing layer within a stack of laminated layers, each sensing layer comprising a spacer layer with the sensing component mounted therein;
   an electrical coupling between laminated layers neighboring the sensing layer; and
   a winding assembly wound around each respective limb.

2. The transformer system of claim 1, wherein:
the at least one sensing layer comprises a sensing layer, and the sensing layer is positioned at a substantially central position within the stack of laminated layers.

3. The transformer system of claim 1, wherein:
the at least one sensing layer comprises two or more sensing layers, and the two or more sensing layers are distributed substantially equidistant from each other within the stack of laminated layers.

4. The transformer system of claim 1, wherein each sensing layer comprises:
the spacer layer with a path defined therein; and
the sensing component mounted within the path.

5. The transformer system of claim 4, wherein the path extends along a length of the spacer layer.

6. The transformer system of claim 4, wherein the path extends along a width of the spacer layer.

7. The transformer system of claim 4, wherein at least a portion of the path comprises an oscillating pattern.

8. The transformer system of claim 1, wherein the sensing component comprises an optical fiber.

* * * * *